US007601484B2

(12) United States Patent
DeVoe et al.

(10) Patent No.: US 7,601,484 B2
(45) Date of Patent: Oct. 13, 2009

(54) MULTIPHOTON CURING TO PROVIDE ENCAPSULATED OPTICAL ELEMENTS

(75) Inventors: Robert J. DeVoe, Oakdale, MN (US); Catherine A. Leatherdale, St. Paul, MN (US); Jeffrey M. Florczak, Austin, TX (US); Patrick R. Fleming, Lake Elmo, MN (US); John E. Potts, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 614 days.

(21) Appl. No.: 11/282,927

(22) Filed: Nov. 18, 2005

(65) Prior Publication Data

US 2006/0078831 A1 Apr. 13, 2006

Related U.S. Application Data

(62) Division of application No. 10/311,040, filed as application No. PCT/US01/19243 on Jun. 14, 2001, now Pat. No. 7,014,988.

(60) Provisional application No. 60/211,709, filed on Jun. 15, 2000.

(51) Int. Cl.
*G03C 5/00* (2006.01)
(52) U.S. Cl. ..................................... 430/321
(58) Field of Classification Search ............... None
See application file for complete search history.

(56) References Cited

U.S. PATENT DOCUMENTS

| 3,018,262 A | 1/1962 | Schroeder |
| 3,117,099 A | 1/1964 | Proops et al. |
| 3,635,545 A | 1/1972 | VanKerkhove et al. |
| 3,677,634 A | 7/1972 | Mathisen |
| 3,720,921 A | 3/1973 | Schools et al. |
| 3,729,313 A | 4/1973 | Smith |

(Continued)

FOREIGN PATENT DOCUMENTS

DE 2546079 5/1977

(Continued)

OTHER PUBLICATIONS

Lindek et al. "Resolution improvement by non confocal theta microscopy", Opt. Lett., vol. 24(21) pp. 1505-1507 (Nov. 1999).

(Continued)

*Primary Examiner*—John A. McPherson
(74) *Attorney, Agent, or Firm*—Lucy C. Weiss; David B. Kagan

(57) ABSTRACT

Methods of fabricating optical elements that are encapsulated in monolithic matrices. The present invention is based, at least in one aspect, upon the concept of using multiphoton, multi-step photocuring to fabricate encapsulated optical element(s) within a body of a photopolymerizable composition. Imagewise, multi-photon polymerization techniques are used to form the optical element. The body surrounding the optical element is also photohardened by blanket irradiation and/or thermal curing to help form an encapsulating structure. In addition, the composition also incorporates one or more other, non-diffusing binder components that may be thermosetting or thermoplastic. The end result is an encapsulated structure with good hardness, durability, dimensional stability, resilience, and toughness.

17 Claims, 3 Drawing Sheets

U.S. PATENT DOCUMENTS

| | | |
|---|---|---|
| 3,741,769 A | 6/1973 | Smith |
| 3,758,186 A | 9/1973 | Brumm |
| 3,779,778 A | 12/1973 | Smith et al. |
| 3,806,221 A | 4/1974 | Kiemle |
| 3,808,006 A | 4/1974 | Smith |
| 3,954,475 A | 5/1976 | Bonham et al. |
| 3,987,037 A | 10/1976 | Bonham et al. |
| 4,041,476 A | 8/1977 | Swainson |
| 4,078,229 A | 3/1978 | Swanson et al. |
| 4,228,861 A | 10/1980 | Hart |
| 4,238,840 A | 12/1980 | Swainson |
| 4,250,053 A | 2/1981 | Smith |
| 4,279,717 A | 7/1981 | Eckberg et al. |
| 4,288,861 A | 9/1981 | Swainson et al. |
| 4,333,165 A | 6/1982 | Swainson et al. |
| 4,394,403 A | 7/1983 | Smith |
| 4,394,433 A | 7/1983 | Gatzke |
| 4,458,345 A | 7/1984 | Bjorklund et al. |
| 4,466,080 A | 8/1984 | Swainson et al. |
| 4,471,470 A | 9/1984 | Swainson et al. |
| 4,491,628 A | 1/1985 | Ito et al. |
| 4,496,216 A | 1/1985 | Cowan |
| 4,515,445 A | 5/1985 | Muller et al. |
| 4,547,037 A | 10/1985 | Case |
| 4,588,664 A | 5/1986 | Fielding et al. |
| 4,642,126 A | 2/1987 | Zador et al. |
| 4,652,274 A | 3/1987 | Boettcher et al. |
| 4,666,236 A | 5/1987 | Mikami et al. |
| 4,775,754 A | 10/1988 | Vogel et al. |
| 4,859,572 A | 8/1989 | Farid et al. |
| 4,877,717 A | 10/1989 | Suzuki et al. |
| 4,963,471 A | 10/1990 | Trout et al. |
| 5,006,746 A | 4/1991 | Kasuga et al. |
| 5,034,613 A | 7/1991 | Denk et al. |
| 5,035,476 A | 7/1991 | Ellis et al. |
| 5,037,917 A | 8/1991 | Babb et al. |
| 5,145,942 A | 9/1992 | Hergenrother et al. |
| 5,159,037 A | 10/1992 | Clement et al. |
| 5,159,038 A | 10/1992 | Babb et al. |
| 5,225,918 A | 7/1993 | Taniguchi et al. |
| 5,235,015 A | 8/1993 | Ali et al. |
| 5,283,777 A | 2/1994 | Tanno et al. |
| 5,289,407 A | 2/1994 | Strickler et al. |
| 5,377,043 A | 12/1994 | Pelouch et al. |
| 5,405,733 A | 4/1995 | Sirkin et al. |
| 5,422,753 A | 6/1995 | Harris |
| 5,446,172 A | 8/1995 | Crivello et al. |
| 5,478,869 A | 12/1995 | Takahashi et al. |
| 5,479,273 A | 12/1995 | Ramsbottom |
| 5,529,813 A | 6/1996 | Kobsa et al. |
| 5,545,676 A | 8/1996 | Palazzotto et al. |
| 5,633,735 A | 5/1997 | Hunter et al. |
| 5,665,522 A | 9/1997 | Vogel et al. |
| 5,703,140 A | 12/1997 | Kunita et al. |
| 5,747,550 A | 5/1998 | Nohr et al. |
| 5,750,641 A | 5/1998 | Ezzell et al. |
| 5,753,346 A | 5/1998 | Leir et al. |
| 5,759,721 A | 6/1998 | Dhal et al. |
| 5,759,744 A | 6/1998 | Brueck et al. |
| 5,770,737 A | 6/1998 | Reinhardt et al. |
| 5,832,931 A | 11/1998 | Wachter et al. |
| 5,847,812 A | 12/1998 | Ooki et al. |
| 5,854,868 A | 12/1998 | Yoshimura et al. |
| 5,856,373 A | 1/1999 | Kaisaki et al. |
| 5,859,251 A | 1/1999 | Reinhardt et al. |
| 5,864,412 A | 1/1999 | Wilde |
| RE36,113 E | 2/1999 | Brueck et al. |
| 5,912,257 A | 6/1999 | Prasad et al. |
| 5,952,152 A | 9/1999 | Cunningham et al. |
| 5,998,495 A | 12/1999 | Oxman et al. |
| 6,005,137 A | 12/1999 | Moore et al. |
| 6,020,591 A | 2/2000 | Harter et al. |
| 6,025,406 A | 2/2000 | Oxman et al. |
| 6,025,938 A | 2/2000 | Kathman et al. |
| 6,030,266 A | 2/2000 | Ida et al. |
| 6,043,913 A | 3/2000 | Lu et al. |
| 6,048,911 A | 4/2000 | Shustack et al. |
| 6,051,366 A | 4/2000 | Baumann et al. |
| 6,100,405 A | 8/2000 | Reinhardt et al. |
| 6,103,454 A | 8/2000 | Dhar et al. |
| 6,107,011 A | 8/2000 | Gelbart |
| 6,115,339 A | 9/2000 | Winarski |
| 6,215,095 B1 | 4/2001 | Partanen et al. |
| 6,262,423 B1 | 7/2001 | Hell et al. |
| 6,267,913 B1 | 7/2001 | Marder et al. |
| 6,297,910 B1 | 10/2001 | Xuan et al. |
| 6,312,876 B1 | 11/2001 | Huang et al. |
| 6,316,153 B1 | 11/2001 | Goodman et al. |
| 6,322,931 B1 | 11/2001 | Cumpston et al. |
| 6,322,933 B1 | 11/2001 | Daiber et al. |
| 6,327,074 B1 | 12/2001 | Bass et al. |
| 6,441,356 B1 | 8/2002 | Mandella et al. |
| 6,469,755 B1 | 10/2002 | Adachi et al. |
| 6,541,591 B2 | 4/2003 | Olson et al. |
| 6,608,228 B1 | 8/2003 | Cumpston et al. |
| 6,618,174 B2 | 9/2003 | Parker et al. |
| 6,624,915 B1 | 9/2003 | Kirkpatrick et al. |
| 6,703,188 B1 | 3/2004 | Kagami et al. |
| 6,750,266 B2 | 6/2004 | Bentsen et al. |
| 6,852,766 B1 | 2/2005 | DeVoe |
| 6,855,478 B2 | 2/2005 | DeVoe et al. |
| 7,014,988 B2 | 3/2006 | DeVoe et al. |
| 7,026,103 B2 | 4/2006 | DeVoe et al. |
| 7,060,419 B2 | 6/2006 | Bentsen et al. |
| 7,166,409 B2 | 1/2007 | Fleming et al. |
| 2002/0034693 A1 | 3/2002 | Fukuda et al. |
| 2003/0155667 A1 | 8/2003 | DeVoe et al. |
| 2004/0012872 A1 | 1/2004 | Fleming et al. |
| 2004/0067431 A1 | 4/2004 | Arney et al. |
| 2004/0223385 A1 | 11/2004 | Fleming et al. |
| 2005/0009175 A1 | 1/2005 | Bergh et al. |
| 2005/0054744 A1 | 3/2005 | DeVoe |
| 2007/0087284 A1 | 4/2007 | Fleming et al. |

FOREIGN PATENT DOCUMENTS

| | | |
|---|---|---|
| DE | 41 42 327 | 6/1993 |
| DE | 42 19 376 | 12/1993 |
| DE | 4326473 | 2/1995 |
| DE | 196 53 413 | 6/1998 |
| JP | 62-097791 | 5/1987 |
| JP | 05-288992 | 11/1993 |
| JP | 6-265710 | 9/1994 |
| WO | WO 92/00185 | 1/1992 |
| WO | WO 97/27519 | 7/1997 |
| WO | WO 98/21521 | 5/1998 |
| WO | WO 98/28775 | 7/1998 |
| WO | WO 99/23650 | 5/1999 |
| WO | WO 99/53242 | 10/1999 |
| WO | WO 99/54784 | 10/1999 |
| WO | WO 02/079691 | 10/2002 |

OTHER PUBLICATIONS

Lakowicz et al., "Fluorescence Spectral Properties of 2,5-Diphenyl-1,3,4-oxadiazole with Two-Color Two-Photon Excitation", J. Phys. Chem., vol. 100(50) pp. 19406-19411 (1996).

Cambaliza et al., "Advantages of two-color excitation fluorescence microscopy with two confocal excitation beams," Opt. Commun. vol. 184(1-4) pp. 25-35 (Oct. 2000).

Bogdanov et al., "Parallel, confocal, and complete spectrum imager for fluorescent detection of high density micro array", Proc. SPIE vol. 3605 pp. 298-307 (Jan. 1999).

Hell et al., "Fundamental improvement of resolution with a 4Pi-confacl fluorescence microscope using two photon excitation". Opt. Commun. vol. 93 (5,6) pp. 277-282 (1992).

Payne et al. "High intensity laser beam attenuation based upon two-step absorption mechanism". J. Appl. Phys. vol. 72(9) pp. 4281-4287 (Nov. 1992).

Clark et al., "Fiber Delivery of Femosecond pulses from a Ti:sapphire Laser", Opt. Lett., vol. 26(17) pp. 1320-1322 (Sep. 2001).

Corning SNF-28 Optical Fiber (Product Brochure PI1036(Apr. 2002) 4 pages.

Göbel, "Distortion-Free Delivery of Nanojoule Femtosecond Pulses from a Ti:sapphire laser through a Hollow-core Photonic Crystal Fiber", Opt. Lett. vol. 29(11) pp. 1285-1287 (Jun. 2004).

Grime, G.W. , "Holographic Diffraction Grating Recorded in Photoresist", in Non-Silver Photographic Processes, Cox, Ed. (1975).

Webpage Journal of Physical Organic Chemistry, vol. 13, issue 12, (Dec. 2000) "Published online: Nov. 9, 2000" (3 pages).

Macromol. vol. 33(5) table of contents (Mar. 7, 2000).

Ischihara et al. "High speed copnfocal fluorescence microscopy using a nipkow scanner . . . ", Bioimages 4(23) p. 57-62 (Jun. 1996) is discusssed in Hell et al. '423.

Tiziani et al. "Three-dimensional analysis by a microlens-array confocal arrangement" App. Opt., vol. 33(4) pp. 567-572 (Feb. 1994).

R. D. Allen, G. M. Wallraff, W. D. Hinsberg, and L. L. Simpson in High Performance Acrylic Polymers for Chemically Amplified Photoresist Applications, *J. Vac. Sci. Technol.* B, 9, 3357 (1991).

C. Xu and W. W. Webb in *J. Opt. Soc. Am. B*, 13, 481 (1996).

R. D Allen et al. in *Proc. SPIE* 2438, 474 (1995).

I. B. Berlman in *Handbook of Fluorescence Spectra of Aromatic Molecules*, Second Edition, pp. 24-27, Academic Press, New York (1971).

J. N. Demas and G. A. Crosby in *J. Phys. Chem.* 75, 991-1024 (1971).

J. V. Morris, M. A. Mahoney, and J. R. Huber in *J. Phys. Chem. 80*, 969-974 (1976).

*Bull. Chem. Soc.* Japan, 42, 2924-2930 (1969).

R. J. Cox, *Photographic Sensitivity*, Academic Press (1973), R.J. Cox, ed., pp. 241-263.

D. F. Eaton in *Advances in Photochemistry*, B. Voman et al., vol. 13, pp. 427-488, (1986).

Beringer et al., *J. Am. Chem. Soc. 81*, 342 (1959).

Makukha et al., Two-Photon-Excitation Spatial Distribution for Cross Focused Gaussian Beams, *Applied Optics*, vol. 40, No. 23, pp. 3932-3936 (Aug. 10, 2001).

Bunning et al. Electronically Switchable Grating Formed Using Ultrafast Holographic Two-Photon-Induced Photopolymerization, *Chem. Mater.*, 2000, 12 pp. 2842-2844.

Diamond et al., Two-Photon Holography in 3-D Photopolymer Host-Guest Matrix, *Optics Express*, vol. 6, No. 3, Jan. 31, 2000, pp. 64-68.

Diamond et al., Two-Photon Holography in 3-D Photopolymer Host-Guest Matrix: errata ,*Optics Express*, vol. 6, No. 4, Feb. 14, 2000, pp. 109-110.

Ashley et al., Holographic Data Storage, *IBM J. Res. Develop.* vol. 44, No. 3, May 2000, pp. 341-368.

Belfield et al., Near-IR Two-Photon Photoinitiated Polymerization Using a Fluorone/Amine Initiating System, *J. Am. Chem. Soc.*, 2000, 122 pp. 1217-1218.

Campagnola et al., 3-Dimensional Submicron Polymcrization of Acrylamide By Multiphoton Excitation of Xanthene Dyes, *Macromolecules*, 2000, vol. 33, pp. 1511-1513.

Hong-Bo Sun et al., Three-dimensional Photonic Crystal Structures Achieved With Two-Photon-Absorption Photopolymerization of Material, *Applied Physics Letters*, vol. 74, No. 6, Feb. 8, 1999, pp. 786-788.

Cumpston et. al. Two-Photon Polymerization Initiators For Three-Dimensional Optical Data Storage and Microfabrication, *Nature*, vol. 398, Mar. 4, 1999, pp. 51-54.

Joshi et al., Three-dimensional Optical Circuitry Using Two-Photo-Assisted Polymerization, *Applied Physics Letters*, vol. 74, No. 2, Jan. 11, 1999, pp. 170-172.

Bunning et al., Electrically Switchable Grating Formed Using Ultrafast Holographic Two-Photon-Induced Photopolymerization, *Chem. Mater.* 2000, vol. 12, pp. 2842-2844.

Kirkpatrick et al. Holographic Recording Using Two-Photon-Induced Photopolymerization, *Appl. Phys. A*, vol. 69, pp. 461-464, 1999.

Maruo s et al., Movable Microstructures made by Two-Photon Three-Dimensional Microfabrication, 1999 *International Symposium on Micromechatronics and Human Science*, vol. 23, pp. 173-178 XP002191032.

Kuebler S M et al., Three-Dimensional Microfabrication Using Two-Photon Activated Chemistry, *SPIE* vol. 3937, pp. 97-105, Jan. 27, 2000 XP008000209.

Cumpston B H et al., New Photopolmers Based on Two-Photon Absorbing Chromophores and Application to Three-Dimensional Microfabrication and Optical Storage, *Mat. Res. Soc. Symp. Proc.*, vol. 488, pp. 217-225, 1998, XP008000191.

Kawata S. et al., Photon-Iduces Micro/Nano Fabrication, Manipulation and Imaging with Unconvential Photo-Active Systems, *Mol. Cryst. Liq. Cryst.*, vol. 314, pp. 173-178, Aug. 25, 1997, XP001059839.

Tanaka et al., Three-Dimensional Fabrication and Observation of Micro-Structures Using Two-Photon Absorption and Fluorescence, *SPIE*, vol. 3937, pp. 92-96, Jan. 27, 2000, XP001051866.

Wenseleers et al., Five Orders-of-Magnitude Enhancement of Two-Photon Absorption for Dyes On Silver Nanoparticle Fractal Clusters, *J. Phys. Chem. B*, vol. 106, pp. 6853-6863, 2002.

Zhou et al.. Efficient Photacids Based Upon Triarylamine Dialkylsulfonium Salts, *J. Am. Chem. Soc.*, vol. 124, No. 9, pp. 1897-1901, Mar. 2002.

Zhou et al., An Efficient Two-Photon-Generated Photoacid Applied To Positive-Tone 3D Microfabrication, *Science*, vol. 296, pp. 1106-1109, May 10, 2002.

Stellacci et al., Laser and Electon-Beam Induced Growth of Nanoparticles for 2D and 3D Metal Patterning, *Adv. Mater.*, vol. 14, No. 3, pp. 194-198, Feb. 2002.

Watanabe et al., Photoreponsive Hydrogel Microstructure Fabricated by Two-Photon Initiated Polymerization, *Adv. Func. Mater.*, vol. 12, No. 9, pp. 611-614, Sep. 2002.

Hong-Bo Sun, Real Three-Dimensional Microstructures Fabricated By Phtopolymerization of Resins Through Two-Photon Absorption, *Optical Letters*, vol. 25, No. 5, pp. 1110-1112, Aug. 2000.

Misawa et al., Microfabrication By Femtosecond Laser Irradiation, *SPIE.*, vol. 3933, pp. 246-260, 2000.

Miwa, Femtosecond Two-Photon Stereo-Lithography, *Applied Physics A*, vol. 73, No. 5, pp. 561-566, 2001.

Kawata et al., Two-Photon Photopolymerization of Functional Micro-Devices, *Journal of Photopolymer Science and Technology*, vol. 15, No. 3, pp. 471-474, 2002.

Boiko et al., Thresold Enhancement in Two-Photon Photopolymerization, *SPIE*, vol. 4097, pp. 254-263, 2000.

Belfield et al., Multiphoton-Absorbing Organic Materials For Microfabrication, emerging Optical Applications and Non-Destructive Three-Dimensional Imaging, *J. Phys. Org.*, vol. 13, pp. 837-849, 2000.

Serbin et al., Femtosecond Laser-Induced Two-Photon Polymerization of Inorganic-Organic Hybrid Materials for Applications in Photonics, *Optics Letters*, vol. 28, No. 5, pp. 301-303, Mar. 2003.

Davidson, The Chemistry of Photoinitiators Some Recent Developments, *J. Photochem. Photobiol. A.*, vol. 73, pp. 81-96, 1993.

Dektar et al., Photochemistry of Triarylsulfonium Salts, *J. Am. Chem. Soc.*, vol. 112, pp. 6004-6015, 1990.

Denk et al., Two-Photon Laser Scanning Fluorescence Microscopy, *Science*, vol. 248, pp. 73-76, Apr. 1990.

Dvornikov et al., Two-Photon Three-Dimensional Optical Storage Memory, *Advances in Chemistry Series*, vol. 240, pp. 161-177, 1994.

Goppert-Mayer, Uber Elmentarakte Mit zwei Quantesprungen, *Ann. Phys.*, vol. 9, pp. 273-294, 1931.

Ito, Chemical Amplification Resists: History and Development Within IBM, *IBM J. Res. Develop.*, vol. 41, No. 1/2, pp. 69-80, Mar. 1997.

Jenkins et al., *Fundamentals of Optics*, 3rd Edition, McGraw-Hill, New York, pp. 331, 1957.

Kavarnos et al., Photosensitization By Reversible Electron Transfer: Theories, Experimental Evidence, and Examples, *Chem. Rev.*, vol. 86, pp. 401-449, Apr. 1986.

Kennedy et al., p-Bis(o-methylstyryl) benzene as a Power-Squared Sensor for Two-Photon Absorption Measurements between 537 and 694 nm, *Anal. Chem.*, vol. 58, pp. 2643-2647, 1986.

Kewitsch et al., Self-Focusing and Self-Trapping of Optical Beams Upon Photopolymerization, *Optics Letters*, vol. 21, No. 1, pp. 24-26, Jan. 1996.

Lee et al., Micromachining Applications of a High Resolution Ultrathick Photoresist, *J.Vac. Sci. Technol. B*, vol. 13, pp. 3012-3016, Dec. 1995.

Lipson et al., Nature of the Potential Energy Surfaces for the Sn1 Reaction A Picosecond Kinetic Study of Homolysis and Heterolysis for Diphenylmethyl Chlorides, *J. Am. Chem. Soc.*, vol. 118, pp. 2992-2997, 1996.

Lorenz et al., SU-8: a low cost negative resist for MEMS, *J. Micromech. Microeng.*, vol. 7, pp. 121-124, 1997.

Maiti et al., Measuring Serotonin Distribution in Live Cells with Three-Photon Excitation, *Science*, vol. 275, pp. 445-588, Jan. 1997.

March, *Advanced Organic Chemistry: Reactions, Mechanisms and Structure*, Four Edition, 1992, Wiley-Interscience, New York, p. 205.

March, *Advanced Organic Chemistry: Reactions, Mechanisms and Structure*, Four Edition, 1992, Wiley-Interscience, New York, Chapter 2.

March, *Advanced Organic Chemistry: Reactions, Mechanisms and Structure*, Four Edition, 1992, Wiley-Interscience, New York, Chapter 9.

Maruo et al., Two-Photon-Absorbed Photopolymerization for Three-Dimensional Microfabrication, *IEEE, The Tenth Annual International Workshop on Micro Electro Mechanical Systems*, pp. 169-174, 1997.

Maruo et al., Three-Dimensional Microfabrication With Two-Photon-Absorbed Photopolymerization, *Optics Letters*, vol. 22, No. 2, pp. 132-134, Jan. 1997.

McClelland et al., Laser Flash Photolysis of 9-Fluorenol. Production and Reactivities of the 9-Fluorenol Radical Cation and the 9-Fluorenyl Cation, *J. Am. Chem. Soc.*, vol. 112, pp. 4857-4861, 1990.

McClelland et al., Flash Photolysis Study of a Friedel-Crafts alkylation. Reaction of the Photogenerated 9-Fluorenyl cation with aromatic compounds, *J. Chem. Soc.*, vol. 2, pp. 1531-1543, 1996.

Odian, *Principles of Polymerization Second Edition John Wiley & Sons*, New York, 1981, pp. 181.

Richardson, Langmuir-Blodgett Films, *An Introduction to Molecular Electronics*, Chapter 10, 1995.

Pitts et al., Submicro Multiphoton Free-Form Fabrication of Proteins and Polymers: Studies of Reaction Efficiencies and Applications in Sustained Release, *Macromolecules*, vol. 33, pp. 1514-1523, 2000.

He et al., Two-Photon Absorption and Optical-Limiting Properties of Novel Organic Compounds, *Optics Letters*, vol. 20, No. 5, pp. 435-437, Mar. 1995.

Parthenopoulos et al., Three-Dimensional Optical Storage Memory, *Science*, vol. 245, pp. 843-845, Aug. 1989.

Shaw et al., Negative Photoresists for Optical Lithography, *IBM J. Res. Develop.*, vol. 41, No. 1/2, pp. 81-94, Jan./Mar. 1997.

Shirai et al., Photoacid and Photobase Generators: Chemistry and Applications to Polymeric Materials, *Prog. Polym. Sci.*, vol. 21, pp. 1-45, 1996.

Smith, *Modern Optic Engineering*, 1966, McGraw-Hill, pp. 104-105.

Strickler et al., Three-Dimensional Optical Data Storage in Refractive Media by Two-Photon Point Excitation, *Optics Letters*, vol. 16, No. 22, pp. 1780-1782, Nov. 1991.

Strickler et al., 3-D Optical Data Storage By Two-Photon Excitation, *Adv. Mater.*, vol. 5, No. 6, pp. 479, 1993.

Thayumanavan et al., Synthesis of Unsymmetrical Triarylamines for Photonic Applications via One-Pot Palladium-Catalyzed Aminations, *Chem. Mater.*, vol. 9, pp. 3231-3235, 1997.

Wan et al., Contrasting Photosolvolytic Reactivities of 9-Fluorenol vs. 5-Suberenol Derivatives. Enhanced Rate of Formation of Cyclically Conjugated Four $\pi$ Carbocations in the Excited State, *J. Am. Chem. Soc.*, vol. 111, pp. 4887-4895, 1989.

Williams et al., Two-Photon Molecular Excitation Provides Intrinsic 3-Dimensional Resolution for Laser-based Microscopy and Microphotochemistry, *FASEB Journal*, vol. 8, pp. 804-813, Aug. 1994.

Xu et al., Multiphoton Fluorescence Excitation: New Spectral Windows for Biological Nonlinear Microscopy, *Proc. Natl. Acad. Sci. USA*, vol. 93, pp. 10763-10768, Oct. 1996.

Yuste et al., Dendritic Spines as Basic Functional Units of Neuronal Integration, *Nature*, vol. 375, pp. 682-684, Jun. 1995.

Kosar, Photochemical Formation and Destruction of Dyes, *Light-Sensitive Systems*, John Wiley & Sons, New York, NY, 1965, Chapter 8.

Badlwinson, Auxiliaries Associated With Main Dye Classes, *Colorants and Auxiliaries*, vol. 2, 1990, Chapter 12.

Syper et al., Synthesis of Oxiranylquinones as New Potential Bioreductive Alkylating Agents, *Tetrahedron*, vol. 39, No. 5, pp. 781-792, 1983.

Zollinger, *Color Chemistry*, VCH, Weinheim, GE, 1991, Chapter 8.

Misawa et al., Multibeam Laser Manipulation and Fixation of Microparticles, *Appl. Phys. Letter*, vol. 60, No. 3, pp. 310-312, Jan. 20, 1992. (XP 002189602).

Sun et al., Photonic Crystal Structures With SubmicrometerSpatial Resolution Achieved By High Power Femtosecond Laser-Induced Photopolymerization, *SPIE*, vol. 3888, pp. 122-130, 2000. (XP 001051864).

Belfield et al., *Near-IR two photon absorbing dyes and photoinitiated cationic polymerization*, Polymer Preprints, vol. 41(1) pp. 578-579 (Mar. 2000).

XP24115893, Krongauz et al., Polymer, 34(17), 3614-3619 (1993).

MULTIPHOTON CURING TO PROVIDE ENCAPSULATED OPTICAL ELEMENTS

STATEMENT OF PRIORITY

This application is a divisional of U.S. Ser. No. 10/311,040 filed on Dec. 12, 2002, now U.S. Pat. No. 7,014,988 which was the National Stage of International Application No. PCT/US01/19243, filed Jun. 14, 2001, which claimed the priority of U.S. Provisional Application No. 60/211,709 filed Jun. 15, 2000, which prior applications are hereby incorporated by reference.

FIELD OF THE INVENTION

This invention relates to the use of multiphoton-induced photopolymerization methods for fabricating optically functional elements (e.g., waveguides, diffraction gratings, splitters, couplers, lenses, ring resonators, other optical circuitry, and the like, etc.) that find particular utility in optical communication systems.

BACKGROUND OF THE INVENTION

Optical interconnects and integrated circuits may be used, in one application, to optically connect one or more optical fibers to one or more remote sites, typically other optical fibers. For example, where light is carried by one or more input fiber(s), the light may be transferred to, split between, or merged into one or more remote sites. Active or passive devices within the optical integrated circuit may also modulate or switch the input signal. Optical interconnects play an important role in fiber telecommunication, cable television links, and data communication. A waveguide is a type of optical interconnect.

For the most part, commercially available optical interconnects have been made of glass. Such interconnects, or couplers, are generally made by fusing glass optical fibers or by attaching glass fibers to a planar, glass integrated optical device that guides light from input fiber(s) to output fiber(s) attached to different ends of the device. Both approaches are labor intensive and costly. The cost increases proportionately with the number of fibers used due to the additional labor needed to fuse or attach each individual fiber. Such intensive labor inhibits mass production of these devices.

A further problem results from the mismatch in shape of the optical modes in the glass fiber and the integrated optical device. Glass fiber cores are typically round, whereas the channel guides tend to have rectilinear cross-sections. This mismatch tends to cause insertion losses when a fiber is butt coupled to an integrated optical device. Thus, there is a strong need for an integrated optical device or interconnect that can be easily attached to optical fibers with good mode matching.

As compared to glass structures, polymeric optical structures offer many potential advantages, and it would be desirable to have polymeric optical elements that could satisfy the demands of the telecommunications and data communications industries. Advantages of polymeric elements would include versatility of fabrication techniques (such as casting, solvent coating, and extrusion followed by direct photo-patterning), low fabrication temperatures (down to room temperature, allowing compatibility with a greater variety of other system components and substrates than is possible with the high processing temperatures characteristic of inorganic materials), and the potential ability to fabricate unique devices in three dimensions, all of which could lead to lower cost and high volume production.

Unlike glass optical interconnects, two-dimensional, polymeric channel waveguides are relatively easily produced. Numerous methods for fabricating polymeric waveguides have been developed. For example, electroplating nickel onto a master to form a channel waveguide mold and using photoresist techniques to form waveguide channels have been known for years. Cast-and-cure methods have supplemented older injection molding methods of forming polymeric channel waveguides. Following formation of the channel waveguide, further cladding and protective coatings typically is added inasmuch as polymeric waveguides generally must be protected from the environment to prevent moisture uptake or damage that could adversely affect performance.

The manufacture of other three dimensional, micro-optical elements has been quite challenging. Ion diffusion methods involve complex, multistep processes to build three dimensional structures. Photolithographic techniques, e.g., photoresist reflow, have been used to make lenses and the like. However, the range of shapes that can be made using lithography are limited by a number of factors including surface tension effects. Photolithography also is limited to the fabrication of elements whose optical axis is normal to the substrate upon which the element is fabricated. It is difficult, for instance, to make elements with accurate undercuts using photolithography.

U.S. Pat. No. 5,402,514 describes a different approach for manufacturing a polymeric, three dimensional interconnect by laminating dry films together. In these laminate structures, the outer layer(s) function as the cladding and the inner layers incorporate the optical circuitry. Single photon photopolymerization is used to photocure portions of each lamina. In order to build up three-dimensional circuitry using this approach, multiple exposure steps would be required to form each photocured lamina. Alignment of the layers during assembly to form the laminate structure could also prove problematic. The layers would also be subject to delamination if the bond quality between layers is poor.

Multiphoton polymerization techniques offer the potential to fabricate three dimensional optical structures more conveniently. Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon induced photoprocesses and single-photon induced processes. Whereas single-photon absorption scales linearly with the intensity of the incident radiation, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the adsorbing chromophore is excited with a number of photons whose total energy equals the energy of an excited state of the chromophore, even though each photon individually has insufficient energy to excite the chromophore. Because the exciting light is not attenuated by single-photon absorption within a curable matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been foreshadowed by applying multiphoton absorption to the areas of photocuring and microfabrication. For example, in multiphoton lithography or stereolithography, the nonlinear scaling of multiphoton absorption with intensity has provided the ability to write features having a size that is less than the diffraction limit of the light utilized, as well as the ability to write features in three dimensions (which is also of interest for holography).

The use of multiphoton-induced photopolymerization has been described in Mukesh P. Joshi et al., "Three-dimensional optical circuitry using two-photo-assisted polymerization," Applied Physics Letters, Volume 74, Number 2, Jan. 11, 1999, pp. 170-172; Cornelius Diamond et al., "Two-photon holography in 3-D photopolymer host-guest matrix," OPTICS EXPRESS, Vol. 6, No. 3, Jan. 31, 2000, pp. 64-68; Cornelius Diamond, "OMOS: Optically Written Micro-Optical Systems in Photopolymer," Ph.D. Thesis, January 2000; Brian H. Cumpston et al., "Two-photon polymerization initiators for three-dimensional optical data storage and microfabrication," NATURE, Vol. 398, Mar. 4, 1999, pp. 51-54; T. J. Bunning et al., "Electrically Switchable Gratings Formed Using Ultrafast Holographic Two-Photon-induced Photopolymerization," Chem. Mater. 2000, 12, 2842-2844; Cornelius Diamond et al., "Two-photon holography in 3-D photopolymer host-guest matrix: errata," OPTICS EXPRESS, Vol. 6, No. 4, Feb. 14, 2000, pp. 109-110; S. M. Kirkpatrick et al., "Holographic recording using two-photon-induced photopolymerization," Appl. Phys. A 69, 461-464 (1999); Hong-Bo Sun et al., "Three-dimensional photonic crystal structures achieved with two-photon-absorption photopolymerization of resin," APPLIED PHYSICS LETTERS, Volume 74, Number 6, Feb. 8, 1999, pp. 786-788; Kevin D. Belfield et al., "Near-IR Two-Photon Photoinitiated Polymerization Using a Fluorone/Amine Initiating System," J. Am. Chem. Soc. 2000, 122, 1217-1218.

The stability and quality of three dimensional optical structures made using multiphoton polymerization techniques remains a concern. Elements made to date have not been made in fully cured materials, thus, having poor stability, especially when exposed to light. Others are free standing and are not encapsulated, thus being sensitive to the surrounding environment and having potential stability issues relative to optical performance. It is also more challenging to achieve high circuit density when the boundaries between adjacent elements cannot be controlled with sufficient precision. Other methods have provided elements whose shape, index of refraction properties, and/or other or chemical physical properties degrade in a relatively short time.

Thus, there remains a strong need in the art for direct fabrication of three dimensional, stable polymeric optical elements with a high degree of precision, as desired. There is also a need for an approach that allows devices to be coupled together with low insertion losses and good mode matching.

SUMMARY OF THE INVENTION

The present invention provides methods of fabricating three dimensional, stable optical elements with a high degree of precision. Imagewise multiphoton polymerization and blanket irradiation techniques are combined to fabricate such optical elements in situ in an encapsulating, protective monolithic polymeric matrix. Imagewise, multi-photon polymerization techniques are used to form the optical element within a body incorporating multiphoton polymerizable material. The body surrounding the optical element is also photohardened by blanket irradiation and/or thermal curing to help form an encapsulating structure. The end result is an encapsulated structure with good resolution, hardness, durability, dimensional stability, resilience, refractive index contrast, and toughness.

Thus, in one aspect, the present invention relates to a method of fabricating an encapsulated optical element. A body is provided that includes:

(i) a photopolymerizable precursor comprising a diffusing species, said precursor forming a polymer matrix upon photopolymerization, and said matrix having an index of refraction;

(ii) a substantially non-diffusing binder component having an index of refraction that is lower than the index of refraction of the polymer matrix and that is miscible with the photopolymerizable precursor; and (iii) a multiphoton photoinitiator system.

At least a portion of the body is imagewise exposed to a multiphoton polymerizing fluence of energy under conditions effective to photopolymerize the polymer precursor in a pattern effective to form a three-dimensional optical element. After imagewise exposing the body, at least a portion of the body is non-imagewise exposed, e.g., via blanket irradiation, to a photopolymerizing fluence of energy under conditions such that a monolithic encapsulating matrix is formed around at least a portion of the optical element.

The present invention also provides an innovative method for coupling two optical elements together wherein the juncture between the two elements is formed in situ. The method reduces insertion losses and provides good mode matching. In one such aspect, the present invention relates to a method of coupling a first optical device to a second optical device, comprising the steps of:

(a) providing the first optical device, said first optical device including a partially formed, first optical element at least partially encapsulated in ingredients comprising photocurable functionality; and wherein said partially formed, first optical element has an end that is spaced apart from a boundary of the first optical device by a region comprising a photocurable material;

(b) positioning the first optical device adjacent to the second optical device such that the end of the first optical element is at least approximately juxtaposed in alignment with an end of a second optical element incorporated into the second optical device, wherein the region including photocurable material is positioned between said ends; and (c) photocuring by multiphoton induced polymerization at least a portion of said region under conditions such that the ends of the first and second optical elements are optically coupled together.

In a preferred aspect of coupling two optical devices together in situ, the present invention relates to a method of coupling a first optical device to a second optical device, comprising the steps of:

(a) providing the first optical element device, said first device including a partially formed, first optical element at least partially encapsulated in ingredients comprising a binder, a photocurable matrix precursor, and a multiphoton photoinitiator system, said partially formed optical element having an end that is spaced apart from a boundary of the body such that a multiphoton photocurable region is juxtaposed between the end and the boundary;

(b) providing the second optical element device, said second device including a second optical element having an end to be coupled to the first optical element;

(c) positioning the first optical element device adjacent the second optical element device to at least approximately juxtapose the ends of the first and second optical elements in alignment with each other, wherein the multiphoton photocurable region is positioned between said ends; and (d) photocuring at least a portion of said region under conditions such that the ends of the first and second optical elements are optically coupled together.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Preferred embodiments of the present invention provide methods of preparing optical elements within an encapsulating binder matrix. The preferred methods involve multiphoton-initiated photopolymerization of selected portions of a body by which optical element(s), e.g., those with simple or complex two or three-dimensional geometries, can be formed within the body. In addition to the photopolymerizable material, the composition also includes a substantially non-diffusing binder component that provides, among other advantages, a stable background within which to form the optical element with good resolution. After formation of the optical element, the resultant optical element may be stably encased within some or all of the remaining material by blanket irradiation of the body or other curing, as desired. Blanket irradiation of the body may occur with energy that causes photopolymerization by mechanism(s) involving single and/or multiphoton absorption. Thus, any remaining photopolymerizable material is rendered insensitive to further exposure, enhancing the stability of the structure.

Notwithstanding the blanket irradiation of the body, the separately photopolymerized optical element nonetheless retains refractive index contrast with the surrounding photopolymerized matrix. Depending upon whether the non-diffusing binder component is thermosetting, it, too, may be cured via blanket irradiation (if it has photopolymerizable functionality), thermal energy, chemical crosslinking, or the like. The resultant encapsulated optical elements are useful in integrated optics, for example.

Figure 1:
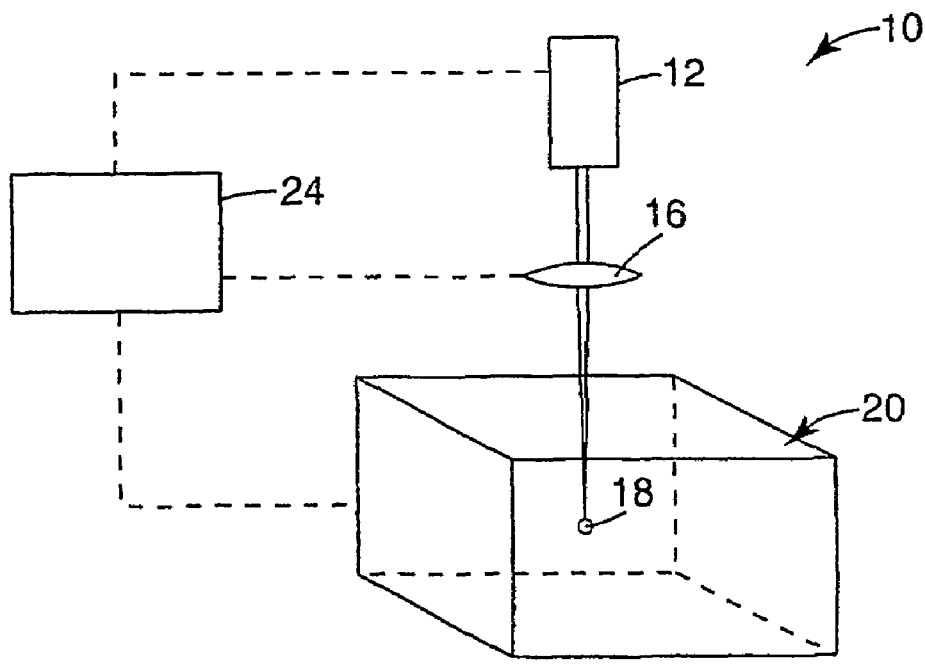
FIG. 1 is a schematic representation of a system for fabricating an encapsulated optical element of the present invention, showing how multiphoton absorption causes photopolymerization within the focal region of laser light directed into a photopolymerizable body.

FIGS. 1 through 4 schematically illustrate one preferred methodology of the present invention in more detail. Referring to FIG. 1, system 10 includes laser light source 12 that directs laser light 14 through optical lens 16. Lens 16 focuses laser light 14 at focal region 18 within body 20 that includes photopolymerizable constituent(s). Laser light 14 has an intensity, and the multiphoton photosensitizer has an absorption cross-section such that the light intensity outside of the focal region is insufficient to cause multiphoton absorption, whereas the light intensity in the portion of the photopolymerizable composition inside the focal region 18 is sufficient to cause multiphoton absorption causing photopolymerization within such focal region 18. In practical effect, this means that the volume of photopolymerizable composition within the focal region 18 will harden via photocuring, while portions of the composition outside of the focal region 18 are substantially unaffected.

A suitable translation mechanism 24 provides relative movement between body 20, Lens 16, and/or and focal region 18 in three dimensions to allow focal region 18 to be positioned at any desired location within body 20. This relative movement can occur by physical movement of light source 12, lens 16, and/or body 20. Through appropriate exposure of successive regions of body 20, and/or through holographic exposure, in an imagewise fashion, the corresponding photopolymerized portions of body 12 may form one or more three-dimensional structures within body 20 that are refractive index images of three dimensional structures. One suitable system would include a mirror-mounted galvonometer with a moving stage.

Useful exposure systems include at least one light source (usually a pulsed laser) and at least one optical element. Preferred light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts.

Another example is a Spectra Physics "Mai Tai" Ti:sapphire laser system, operating at 80 MHz, average power about 0.85 Watts, tunable from 750 to 850 nm, with a pulse width of about 100 femtoseconds. However, in practice, any light source that provides sufficient intensity (to effect multiphoton absorption) at a wavelength appropriate for the photosensitizer (used in the photoreactive composition) can be utilized. Such wavelengths can generally be in the range of about 300 to about 1500 nm; preferably, from about 600 to about 1100 nm; more preferably, from about 750 to about 850 nm.

Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) also can be utilized.

One skilled in the art can choose appropriate settings to use such laser systems to carry out multiphoton polymerization. For example, pulse energy per square unit of area (Ep) can vary within a wide range and factors such as pulse duration, intensity, and focus can be adjusted to achieve the desired curing result in accordance with conventional practices. If Ep is too high, the material being cured can be ablated or otherwise degraded. If Ep is too low, curing may not occur or may occur too slowly.

In terms of pulse duration when using near infrared pulsed lasers, a preferred pulse length is generally less than about $10^{-8}$ second, more preferably less than about $10^{-9}$ second, and most preferably less than about $10^{-11}$ second). Laser pulses in the femtosecond regime are most preferred as these provide a relatively large window for setting Ep levels that are suitable for carrying out multiphoton curing. With picosecond pulses, the operational window is not as large. With nanosecond pulses, curing may proceed slower than might be desired in some instances or not at all, because the Ep level may need to be established at a low level to avoid material damage when the pulses are so long, relatively.

Advantageously, the fabrication method of the present invention allows the use, if desired, of laser light 14 having a wavelength within or overlapping the range of wavelengths of light to be carried by waveguide 26. This could be desirable because the photoinitiator used absorbs at half the wavelength of the laser line, and so does not attenuate the fundamental. This results in greater latitude in selecting materials for fabricating the optical element or waveguide to minimize absorption of desired wavelengths of light to be carried by the optical element or waveguide. In some embodiments, therefore, laser light 14 may have a wavelength that is substantially the same as the wavelength of light to be carried by waveguide 26. In this context, "substantially the same" means within 10%, preferably within 5%, and more preferably within 1%.

Although lens 16 is shown, other optical elements useful in carrying out the method of the invention can be used to focus light 14 and include, for example, one or more of refractive optical elements (for example, lenses), reflective optical elements (for example, retroreflectors or focusing mirrors), diffractive optical elements (for example, gratings, phase masks, and holograms), diffusers, splitters, couplers, lenses, pockels cells, ring resonators, wave guides, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture characteristics to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20×Fluar).

Exposure times and scan rates generally depend upon the type of exposure system used to cause image formation and its accompanying variables such as numerical aperture, geometry of light intensity spatial distribution, the peak light intensity during the laser pulse (higher intensity and shorter pulse duration roughly correspond to peak light intensity), as well as upon the nature of the composition exposed (and its concentrations of photosensitizer, photoinitiator, and electron donor compound). Generally, higher peak light intensity in the regions of focus allows shorter exposure times, everything else being equal. Linear imaging or "writing" speeds generally can be about 5 to 100,000 microns/second using a laser pulse duration of about 10E-8 to 10E-15 seconds (preferably, about 10E-12 to 10E-14 seconds) and about 10E3 to 10E9 pulses per second (preferably, about 10E5 to 10E8 pulses per second).

Figure 2:
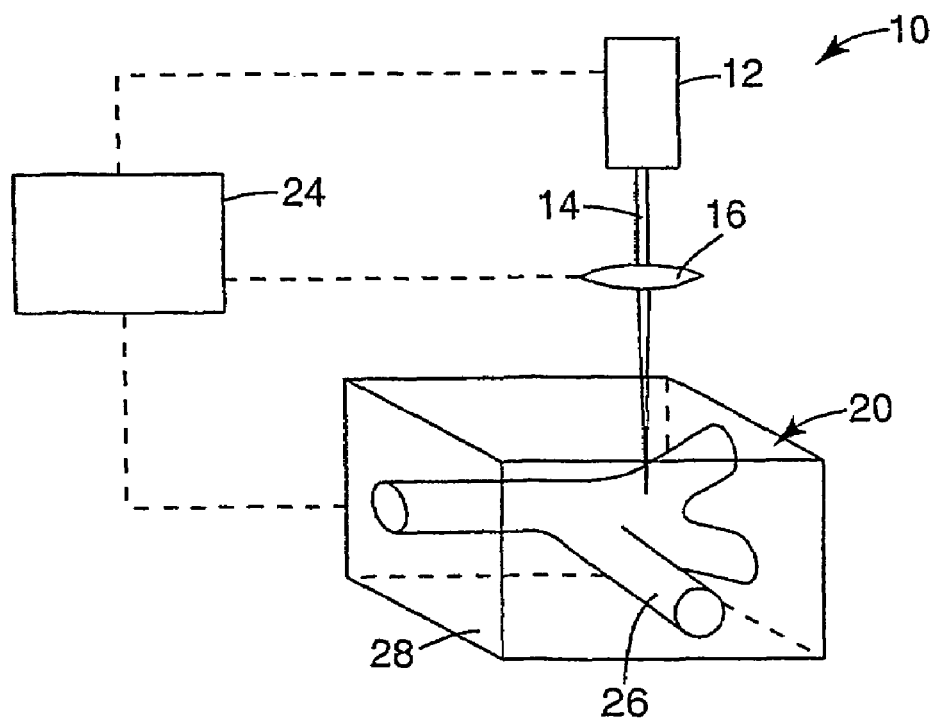
FIG. 2 is a schematic representation of the system of FIG. 1, showing how imagewise exposure formed an optical element in the body.

FIG. 2 shows how imagewise exposure of selected portions of body 20 form photopolymerized, three-dimensional waveguide 26 within body 20. Portions 28 of body 20 that are outside the photopolymerized portions constituting waveguide 26 remain unphotopolymerized at this stage of this embodiment. As a consequence of imagewise photopolymerization, the refractive index of waveguide 26 will be increased relative to that of uncured portions 28. This contrast is generally sufficient to provide waveguiding or other desired optical functionality.

In theory, the waveguide formation is believed to be due, at least in part, to an increase in density of the cured material relative to the uncured material. Upon exposure to the laser light, a multiphoton-induced, photopolymerization reaction occurs in the focal region 18. It is believed that there is then some interdiffusion of relatively low molecular weight species into the exposed region from the unexposed regions, at least near the interface of these regions. This interdiffusion alters and typically further increases the density of the exposed region, raising its refractive index. At the same time, the concentration of the diffusing species is depleted from the unexposed region proximal to the interface, further enhancing the refractive index contrast between the regions. In short, it is believed that this diffusion forms a so-called depletion zone (in the sense that the concentration of diffusing species in the zone is reduced) at the desired optical element boundary, contributing important optical contrast between the element boundary and the surrounding encapsulating material.

A significant advantage of the present invention is that the refractive index profile of the element may be controlled through shaping the mode profile of the writing beam. This is useful for mode matching to other elements and optimizing the mode profile in the optical element 26. The refractive index profile may be further controlled through appropriate choice of one or more other factors, such as the Tg of the binder, monomer size (in order to control the diffusion rate), and temperature of the sample during exposure. For instance, because the distance a monomer molecule can diffuse depends to some degree on its probability of reaction with a growing polymer chain, diffusion can be controlled by controlling such factors as the waveguide width; the time, intensity, and intensity distribution of the exposure; the concentration of the photoinitiator system, and the reactivity and functionality of the monomer or monomers. Since diffusion is a function of molecular weight, shape, and size, monomer diffusion can be controlled by controlling the molecular weight, shape, and size of the monomer or monomers. Diffusion can also be controlled by controlling the viscosity of the monomer or monomers, as well as the glass transition point of the binder. Since some of these properties, such as viscosity also vary with temperature, variation of temperature and some other factor at the same time may produce a complex interaction. Other variables are the time between exposure and the blanket irradiation step (described below) and the temperature at which the element is stored during the period between multiphoton curing and blanket irradiation.

Figure 3:
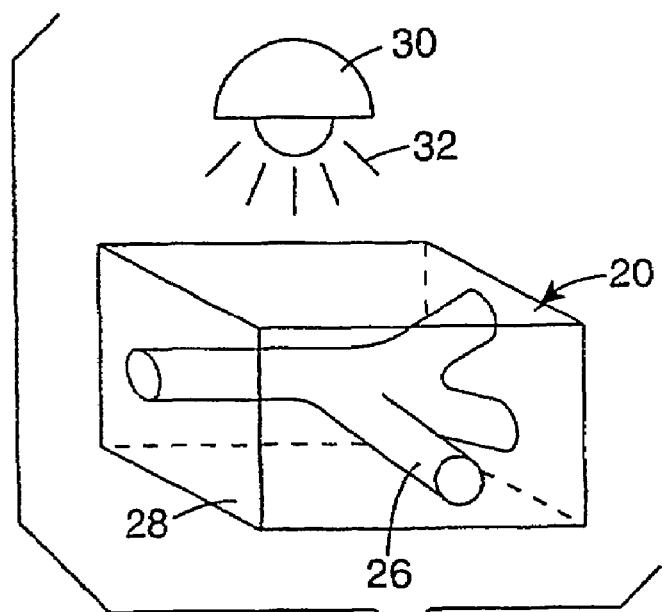
FIG. 3 schematically shows the body of FIG. 2 being blanket irradiated.

FIG. 3 illustrates the step in which body 20 is blanket irradiated, i.e., nonimagewise irradiated, from source 30 with a fluence of energy 32 of a type for which at least the uncured portions 28, and more preferably at least the substantial entirety of body 20 has an optical cross-section for absorption of such energy sufficient to cause photopolymerization of the blanket irradiated portions of body 20. Blanket irradiation can occur using appropriate energy, of an intensity and type effective to induce single and/or multiphoton photopolymerization. As a consequence of blanket irradiation, the photopolymerizable material in uncured portions 28 are cured and hardened, thus encapsulating at least portions of waveguide 26 in a monolithic polymer matrix. The resultant encapsulating structure helps to protect and stabilize waveguide 26. Significantly, even though blanket irradiation might cause photopolymerization through the entirety of body 20, sufficient index of refraction contrast between waveguide 26 and cured portions 28 to support waveguiding is maintained. Preferably, such contrast is greater than 0.03, more preferably greater than 0.04, most preferably greater than 0.05. As described below, it is believed that the formation of a so-called depletion zone at the boundary of the cured optical element via diffusion of low molecular weight species helps to provide such optical contrast.

Advantageously, blanket irradiation promotes dimensional and chemical stability of the structure. Continued diffusion over time might change the shape and refractive index profile of the optical element. Additionally, after blanket irradiation, most, if not all, of the polymerizable species in the composition have been polymerized, rendering the composition chemically inert with respect to further irradiation, heating, or chemical reaction involving polymerization or crosslinking, providing stable, reliable optical elements/devices with improved physical properties compared to the same without blanket irradiation. Additionally, there is reduced potential for health hazards due to the absence, or near absence, of unpolymerized polymer precursor in the finished device after blanket irradiation.

The energy source used for achieving blanket irradiation may be actinic (e.g., radiation having a wavelength in the ultraviolet or visible region of the spectrum), accelerated particles (e.g., electron beam radiation), thermal (e.g., heat or infrared radiation), or the like. Preferably, the energy is actinic radiation or accelerated particles, because such energy provides excellent control over the initiation and rate of curing. Additionally, actinic radiation and accelerated particles can be used for curing at relatively low temperatures. This avoids degrading components that might be sensitive to the relatively high temperatures that might be required to initiate curing of the photopolymerizable groups when using thermal curing techniques. Suitable sources of actinic radiation include mercury lamps, xenon lamps, carbon arc lamps, tungsten filament lamps, lasers, electron beam energy, sunlight, and the like.

Figure 4:
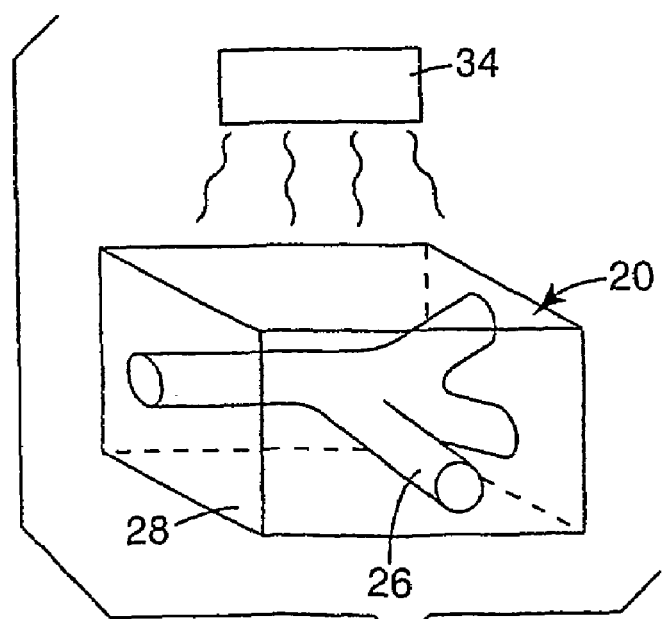
FIG. 4 schematically shows the body of FIG. 3 being heated to cure a thermosetting polymer included in the body.

FIG. 4 shows an optional step in which the optically functional, composite structure resulting from the blanket irradiation step and/or imagewise exposure step is heated by heat source 34 to further cure other any thermosetting materials included in the structure. This step is particularly advantageous when the substantially non-diffusing binder component includes nonphotopolymerizable, yet curable thermosetting polymers that undergo crosslinking when heated. Thermally induced curing may optionally occur with or without a suitable catalyst depending upon the nature of the thermosetting material.

In some embodiments, it can be appreciated that any such thermosetting polymer(s) and the cured photopolymers could form, if desired, entangled, yet substantially separate polymer matrices in which there are substantially no covalent bonds between the two matrices. Such entangled polymer matrices are generally referred to in the art as interpenetrating polymer networks, or IPN's. As another possibility, the materials that form body 20 may include a thermoplastic polymer that does not undergo crosslinking reactions nor covalent bonding with the photopolymerized polymer matrix, yet these may still comprise polymer chains that are entangled within the photopolymerized polymer matrix. Such entangled matrices are generally referred to in the art as semi-interpenetrating polymer networks, or semi-IPN's. The nature of the thermoplastic and/or thermoplastic polymer constituents, if any, as well as other compositional aspects of the photopolymerizable composition incorporated into body 20 will be described in more detail below.

Generally, the materials that constitute body 20 of FIG. 1 generally include (1) a photopolymerizable precursor that forms a cured polymer matrix upon photopolymerization and that incorporates a diffusing species; (2) a substantially non-diffusing binder component that has an index of refraction that is optically contrastable to and lower than the index of refraction of the photocured polymer matrix and that is miscible with the photopolymerizable precursor; and (3) a multiphoton photoinitiator system that preferably includes a multiphoton photosensitizer and optionally at least one photoinitiator that is capable of being photosensitized by the photosensitizer. Optionally, the multiphoton photoinitiator system may also include an electron donor.

As used herein, "photopolymerizable" refers to functionality directly or indirectly pendant from a monomer, oligomer, and/or polymer backbone (as the case may be) that participates in curing reactions upon exposure to a suitable source of curing energy. Such functionality generally includes not only groups that cure via a cationic mechanism upon radiation exposure but also groups that cure via a free radical mechanism. Representative examples of such photopolymerizable groups suitable in the practice of the present invention include epoxy groups, (meth)acrylate groups, olefinic carbon-carbon double bonds, allyloxy groups, alpha-methyl styrene groups, (meth)acrylamide groups, cyanate ester groups, vinyl ethers groups, combinations of these, and the like. Free radically polymerizable groups are preferred. Of these, (meth)acryl moieties are most preferred. The term "(meth)acryl", as used herein, encompasses acryl and/or methacryl.

As used herein, the term "monomer" means a relatively low molecular weight material (i.e., having a molecular weight less than about 500 g/mole) having one or more polymerizable groups. "Oligomer" means a relatively intermediate molecular weight (i.e., having a molecular weight of from about 500 up to about 10,000 g/mole) material having one or more polymerizable groups. "Polymer" means a relatively large molecular weight (i.e., about 10,000 g/mole or more) material that may or may not have available curing functionality. The term "molecular weight" as used throughout this specification means average molecular weight unless expressly noted otherwise. As used herein, the term "resin" shall be used to refer collectively to oligomers and polymers.

The photopolymerizable precursor preferably includes one or more monomers, oligomers, and/or polymers with photopolymerizable functionality. Preferably, the precursor includes at least one such monomer. Subject to desired performance standards, any photopolymerizable monomer or combinations thereof may be incorporated into the photopolymerizable precursor. Accordingly, the present invention is not intended to be limited to specific kinds of photopolymerizable monomers in various aspects so long as any such performance conditions are satisfied. In addition to photopolymerizable functionality, the monomers incorporated into the photopolymerizable precursor may include other functionality or multiple functionality of the same and/or different type.

The photopolymerizable monomers may be mono-, di-, tri-, tetra- or otherwise multifunctional in terms of photopolymerizable moieties. The amount of such monomers to be incorporated into the photopolymerizable precursor can vary within a wide range depending upon the intended use of the resultant composition. As general guidelines, the photopolymerizable precursor may contain from about 10 to about 100, preferably 20 to 90 weight percent of such monomers. Monomers are low molecular weight materials that function as diffusing species in the precursor composition.

Representative examples of monofunctional, photopolymerizable monomers suitable for use in the photopolymerizable precursor include (meth)acrylamide, (meth)acrylic acid, (meth)acrylonitrile, 1,2,4-butanetriol tri(meth)acrylate, 1,3-propanediol di(meth)acrylate, 1,4-cyclohexanediol di(meth) acrylate, 2-(2-ethoxyethoxy)ethyl (meth)acrylate, 2-ethylhexyl (meth)acrylate, 2-hydroxyethyl (meth)acrylate, acrylated oligomers such as those of U.S. Pat. No. 4,642,126); allyl acrylate, alpha-epoxide, alpha-methylstyrene, beta-carboxyethyl (meth)acrylate, bis[1-(2-acryloxy)]-p-ethoxyphenyldimethylmethane, bis[1-(3-acryloxy-2-hydroxy)]-p-propoxyphenyldimethylmethane, copolymerizable mixtures of (meth)acrylated monomers, diallyl phthalate, diethyleneglycol diacrylate, divinyl adipate, divinyl phthalate; divinyl succinate, dodecyl (meth)acrylate, ethyl (meth)acrylate, ethyleneglycol di(meth)acrylate, glycerol di(meth)acrylate, glycerol tri(meth)acrylate, hexyl (meth)acrylate, hydroxy functional caprolactone ester (meth)acrylate, hydroxybutyl (meth)acrylate, hydroxyethyl (meth)acrylate, hydroxyisobutyl (meth)acrylate, etrahydrofurfuryl (meth)acrylate, hydroxymethyl (meth)acrylate, hydroxypropyl (meth)acrylate, hydroxyisopropyl (meth)acrylate, isobornyl (meth)acrylate, isobutyl (meth)acrylate, isodecyl (meth)acrylate, isononyl (meth)acrylate, isooctyl (meth)acrylate, isopropyl methacrylate, itaconic acid, lauryl (meth)acrylate, maleic anhydride, methyl (meth)acrylate, methyl (meth)acrylate, n-butyl (meth)acrylate, n-hexyl (meth)acrylate, nonylphenol ethoxylate (meth)acrylate, N-substituted (meth)acrylamide, N-vinyl-2-pyrrolidone, N-vinylcaprolactam, octyl (meth)acrylate, sorbitol hex(meth)acrylate, stearyl (meth)acrylate, stearyl (meth)acrylate, styrene, substituted styrene, the bis-acrylates and bis-methacrylates of polyethylene glycols of molecular weight about 200-500, unsaturated amides (for example, methylene bis-(meth)acrylamide, methylene bis-(meth)acrylamide, 1,6-hexamethylene bis-(meth)acrylamide, diethylene triamine tris-(meth)acrylamide and beta-(meth)acrylaminoethyl (meth)acrylate); vinyl esters, vinyl ethers, combinations of these and the like. Suitable ethylenically-unsaturated species also are described, for example, by Palazzotto et al. in U.S. Pat. No. 5,545,676 at column 1, line 65, through column 2, line 26 as well as in U.S. Pat. No. 4,652,274, and U.S. Pat. No. 4,642,126).

Preferred monofunctional (meth)acrylates including those with substituted and unsubstituted aromatic groups, such as phenoxyethyl (meth)acrylate, 2-(1-naphthoxy)ethyl(meth) acrylate, 2-(2-naphthoxy)ethyl acrylate, alkoxylated nonylphenol acrylate, and 9-phenanthrylmethyl(meth)acrylate.

Multifunctional photopolymerizable monomers comprising, on average, greater than one photopolymerizable group per molecule, may also be incorporated into the photopolymerizable precursor to enhance one or more properties of the cured structures, including crosslink density, hardness, tackiness, mar resistance, or the like. If one or more multifunctional materials are present, the photopolymerizable precursor may comprise from 0.5 to about 50, preferably 0.5 to 35, and more preferably from about 0.5 to about 25 weight percent of such materials. Examples of such higher functional, photopolymerizable monomers include ethylene glycol di(meth)acrylate, hexanediol di(meth)acrylate, triethylene glycol di(meth)acrylate, tetraethylene glycol di(meth)acrylate, trimethylolpropane tri(meth)acrylate, ethoxylated trimethylolpropane tri(meth)acrylate, glycerol tri(meth)acrylate, pentaerythritol tri(meth)acrylate, pentaerythritol tetra(meth) acrylate, and neopentyl glycol di(meth)acrylate, combinations of these, and the like. Preferred multifunctional (meth) acrylates include those with substituted and unsubstituted aromatic groups, such as ethoxylated bisphenol A di(meth) acrylate, aromatic urethane (meth)acrylates (Such as M-Cure™ 203 and CN972 and CN1963, Sartomer, Inc.), and aromatic epoxy (meth)acrylates (such as CN-120, CN-124, and CN-151, Sartomer, Inc.)

While not preferred, the photopolymerizable precursor may also include one or more resins having photopolymerizable functionality. If present, the photopolymerizable precursor may include 1 to 50 parts by weight of such one or more photopolymerizable resins per 100 parts by weight of the precursor. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

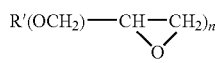

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1004, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4-epoxycyclohexy-lmethyl-3,4-epoxycyclohexene carboxylate (for example, ERL-4221 or Cyracure™ UVR 6110 or UVR 6105 from Union Carbide Corp.), 3,4-epoxy-6-methylcyclohexylm-ethyl-3,4-epoxy-6-methyl-cyclohexene carboxylate (for example, ERL-4201 from Union Carbide Corp.), bis(3,4-epoxy-6-methylcyclohexylmethyl) adipate (for example, ERL-4289 from Union Carbide Corp.), bis(2,3-epoxycyclo-pentyl) ether (for example, ERL-0400 from Union Carbide Corp.), aliphatic epoxy modified from polypropylene glycol (for example, ERL-4050 and ERL-4052 from Union Carbide Corp.), dipentene dioxide (for example, ERL-4269 from Union Carbide Corp.), epoxidized polybutadiene (for example, Oxiron™ 2001 from FMC Corp.), silicone resin containing epoxy functionality, flame retardant epoxy resins (for example, DER™-580, a brominated bisphenol type epoxy resin available from Dow Chemical Co.), 1,4-butanediol diglycidyl ether of phenolformaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl)adipate (for example, ERL-4299 or UVR-6128, from Union Carbide Corp.), 2-(3,4-epoxycyclohexyl-5,5-spiro-3,4-epoxy) cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$-$C_{10}$ glycidyl ether (for example, Heloxy™ Modifier 7 from Resolution Performance Products), alkyl $C_{12}$-$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, HeloXy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279, 717 (Eckberg), which are commercially available from the General Electric Company. These are polydimethylsiloxanes in which 1-20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxy materials include monomers and/or resins having with high refractive index, including aromatic, mono-, di-, and higher functionality, including for instance aromatic glycidyl epoxies (such as phenyl glycidyl ether and the Epon™ resins available from Resolution Performance Products), brominated epoxies, and cycloaliphatic epoxies (such as ERL-4221 and ERL-4299 available from Union Carbide).

One or more polyols are typically provided to co-react with the epoxy functional material(s). Preferred polyols include those with aromatic functionality, including ethoxylated bisphenols, 9,10-bis(2-hydroxyethyl)anthracene, 9-(2-(1,3-dihydroxy)propyl)phenanthrene, and the like. See also U.S. Pat. No. 5,856,373 at col. 4, line 24 to col. 6, line 17. It is preferred that either the epoxy and/or polyol have aromatic functionality, especially if such material(s) are diffusing species.

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized.

Suitable photopolymerizable species also have been described, for example, in Palazzotto et al., U.S. Pat. No. 5,545,676, column 1, line 65 through column 2, line 26, and by Trout et al., U.S. Pat. No. 4,963,471, column 6, line 53 through column 7, line 53. Suitable cationic-polymerizable species are described, e.g., by Oxman et al., U.S. Pat. Nos. 5,998,495 and 6,025,406, and by Dhal, et el., U.S. Pat. No. 5,759,721.

In particularly preferred embodiments, the photopolymerizable precursor comprises (a) 10 to 100, preferably about 90, parts by weight of at least one of 2-(1-napthoxy)ethyl (meth) acrylate, 2-(2-napthoxy)ethyl (meth)acrylate, phenoxy (meth)acrylate, and mixtures thereof per (b) 0.5 to 50, preferably about 10, parts by weight of at least one of trimethylolpropane tri(meth)acrylate (TMPTA), hexanediol di(meth)acrylate, tetraethyleneglycol di(meth)acrylate, and mixtures thereof. The use of the multifunctional materials such as the TMPTA and the like helps to provide dimensional stability over a wide range of temperatures, but the amount used is desirably limited so as to maintain refractive index contrast between the resultant optical element and its encapsulating matrix. Fluorinated (meth)acrylates, preferably fluorinated aromatic (meth)acrylates, such as those described in U.S. Pat. No. 6,005,137, may also be used as all or a part of the precursor.

The non-diffusing binder component incorporated into the photopolymerizable composition provides numerous benefits. Importantly, the relatively large size of preferred embodiments of such a material causes its diffusion rate to be relatively low, allowing the optical element to be formed by multiphoton photopolymerization within a stable background. In addition, the non-diffusing binder component contributes to the physical and refractive index characteristics of the resulting article. For instance, the non-diffusing binder component helps to reduce shrinkage upon curing and improves resilience and toughness, cohesion, adhesion, flexibility, tensile strength, and the like. By choosing the non-diffusing binder component so that it has a lower index of refraction in the cured (if any) and/or uncured states, optical performance of the optical element encapsulated in such a material can be enhanced as well. Generally, to avoid light scattering, the non-diffusing binder component is miscible with the photopolymerizable precursor before and preferably after such precursor is cured. It is also preferred that the non-diffusing binder component is at least substantially non-crystalline before and preferably after the precursor is cured. Preferred materials are also solvent soluble and generally have a weight average molecular weight of at least about 1000, preferably 1000 to 2,000,000 or more.

The non-diffusing binder component may be thermoplastic or thermosetting or sol-based. If thermosetting, the non-diffusing binder component may be photocurable. Alternatively, the thermosetting binder material may include a different kind of curing functionality than does the photopolymerizable precursor. Upon curing, such a material will form an IPN with the photopolymerized matrix material. If a thermoplastic is used, such a material will tend to form a semi-IPN with the photopolymerized matrix material. In one embodiment, the non-diffusing binder component may include pendant hydroxyl functionality. In the presence of an isocyanate crosslinking agent and a suitable catalyst such as dibutyl tin dilaurate, pendant hydroxyl moieties will undergo urethane crosslinking reactions with the NCO groups of the isocyanate crosslinking agent to form a crosslinked network comprising urethane linkages.

Useful thermoplastic polymers may include acrylates and methacrylates, poly(vinyl esters), ethylene/vinyl acetate copolymers, styrenic polymers and copolymers, vinylidene chloride copolymers, vinyl chloride polymers and copolymers, cellulose esters, cellulose ethers, as described in European Patent Application No. 377,182, page 6, lines 8 through 42, and in U.S. Pat. No. 4,963,471, column 5, line 6 through column 6, line 50, combinations of these, and the like.

In other embodiments, the non-diffusing binder component may be a thermosetting polymer selected from epoxy resins, amine-cured epoxy resins, polyacrylates and polymethacrylates, polyurethanes, polytriazines and poly(vinyl ethers), polyesters, polyethers, polysilicones, fluoropolymers, polysulfones, polyimides, polyamides, polyamideimides, polyolefins, with the proviso that the precursors to such thermosetting polymer are chosen such that the resulting thermoset polymer is substantially free of covalent bonds with the multiphotonically photopolymerized polymer matrix. More preferably, the non-diffusing binder component comprises cellulose acetate butyrate such as the CAB-531 material commercially available from Eastman Chemical, Kingsport, Tenn.

As used herein, "substantially non-diffusing" means that the diffusion length over the time between imagewise exposure and blanket exposure is less than the dimensions of optical elements formed in imagewise exposure. Advantageously, this allows the binder to provide a stable background within which to form three-dimensional elements.

The amount of the non-diffusing binder component used may vary within a wide range. Preferably, using 25 to 75 parts by weight of the non-diffusing binder component per 5 to 60 parts by weight of the photopolymerizable precursor would be suitable in the practice of the present invention.

The multiphoton photoinitiator system of the present invention preferably includes at least one multiphoton photosensitizer and at least one photoinitiator that is capable of being photosensitized by the photosensitizer, more preferably additionally including at least one electron donor. While not wishing to be bound by theory, it is believed that light of sufficient intensity and appropriate wavelength to effect multiphoton absorption can cause the multiphoton photosensitizer to be in an electronic excited state via absorption of two photons, whereas such light is generally not capable of directly causing the photocurable materials to be in an electronic excited state by one photon absorption. The photosensitizer is believed to then transfer an electron to the photoinitiator, causing the photoinitiator to be reduced. The reduced photoinitiator can then cause the photocurable materials to undergo the desired curing reactions. As used herein, "cure" means to effect polymerization and/or to effect crosslinking. Thus, by appropriate focusing of such light, photocuring can be controllably induced in the volume of focus with relatively high resolution to form optical elements with simple or complex, three dimensional geometry, as desired.

Multiphoton photosensitizers are known in the art and illustrative examples having relatively large multiphoton absorption cross-sections have generally been described e.g., by Marder, Perry et al., in PCT Patent Applications WO 98/21521 and WO 99/53242, and by Goodman et al., in PCT Patent Application WO 99/54784. Although multiphoton cross-sections greater than fluorescein are not necessary for carrying out the present invention, in preferred aspects of the present invention, multiphoton photosensitizers suitable for use in the multiphoton photoinitiator system of the photoreactive compositions are those that are capable of simultaneously adsorbing at least two photons when exposed to sufficient light and that have a two-photon absorption cross-section greater than that of fluorescein (that is, greater than that of 3',6'-dihydroxyspiro[isobenzofuran-1(3H), 9'-[9H] xanthen]3-one). Generally, the cross-section can be greater than about $50 \times 10^{-50}$ cm$^4$ sec/photon, as measured by the method described by C. Xu and W. W. Webb in J. Opt. Soc. Am. B, 13, 481 (1996) (which is referenced by Marder and Perry et al. in International Publication No. WO 98/21521 at page 85, lines 18-22).

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Assuming that the emitting state is the same under one- and two-photon excitation (a common assumption), the two-photon absorption cross-section of the photosensitizer, ($\delta_{sam}$), is equal to $\delta_{ref}(I_{sam}/I_{ref})(\phi_{sam}/\phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound, $\phi_{sam}$ is the fluoroescence quantum efficiency of the photosensitizer, and $\phi_{ref}$ is the fluorescence quantum efficiency of the reference compound. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregation effects).

Although not necessary for carrying out the present invention, it is preferred that the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the photocurable materials used to form body 20 of the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000-55,000 molecular weight, 9.0-13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see Bull. Chem. Soc. Japan, 42, 2924-2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a multiphoton photosensitizer can also be selected based in part upon shelf stability considerations. Accordingly, selection of a particular photosensitizer can depend to some extent upon the particular reactive species utilized (as well as upon the choices of electron donor compound and/or photoinitiator, if either of these are used).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride) and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge). The four above-described classes of photosensitizers can be prepared by reacting aldehydes with ylides under standard Wittig conditions or by using the McMurray reaction, as detailed in International Patent Publication No. WO 98/21521.

Other multiphoton photosensitizer compounds are described by Reinhardt et al. (for example, in U.S. Pat. Nos. 6,100,405, 5,859,251, and 5,770,737) as having large multiphoton absorption cross-sections, although these cross-sections were determined by a method other than that described herein. Other suitable multiphoton initiators also have also been described in Goodman, et al in PCT Patent Publication WO 99/54784, Mukesh P. Joshi et al., "Three-dimensional optical circuitry using two-photo-assisted polymerization," Applied Physics Letters, Volume 74, Number 2, Jan. 11, 1999, pp. 170-172; Cornelius Diamond et al., "Two-photon holography in 3-D photopolymer host-guest matrix," OPTICS EXPRESS, Vol. 6, No. 3, Jan. 31, 2000, pp. 64-68; Brian H. Cumpston et al., "Two-photon polymerization initiators for three-dimensional optical data storage and microfabrication," NATURE, Vol. 398, Mar. 4, 1999, pp. 51-54; T. J. Bunning et al., "Electrically Switchable Gratings Formed Using Ultrafast Holographic Two-Photon-Induced Photopolymerization," Chem. Mater. 2000, 12, 2842-2844; Cornelius Diamond et al., "Two-photon holography in 3-D photopolymer host-guest matrix: errata," OPTICS EXPRESS, Vol. 6, No. 4, Feb. 14, 2000, pp. 109-110; S. M. Kirkpatrick et al., "Holographic recording using two-photon-induced photopolymerization," Appl. Phys. A 69, 461-464 (1999); Hong-Bo Sun et al., "Three-dimensional photonic crystal structures achieved with two-photon-absorption photopolymerization of material," APPLIED PHYSICS LETTERS, Volume 74, Number 6, Feb. 8, 1999, pp. 786-788; and Kevin D. Belfield et al., "Near-IR Two-Photon Photoinitiated Polymerization Using a Fluorone/Amine Initiating System," J. Am. Chem. Soc. 2000, 122, 1217-1218.

The preferred multiphoton photoinitiator system generally includes an amount of the multiphoton photosensitizer that is effective to facilitate photopolymerization within the focal region of the energy being used for imagewise curing. Using from about 0.01 to about 10, preferably 0.1 to 5, parts by weight of the multiphoton initiator per 100 parts by weight of the photocurable material(s) would be suitable in the practice of the present invention.

In addition to the multiphoton photosensitizer, the preferred multiphoton photoinitiator system of the present invention may include other components that help to enhance the performance of photocuring. For instance, certain one-photon photoinitiators can be photosensitized by the multiphoton photosensitizer and, consequently, function as electron mediators in multiphoton photocuring reactions. One or more electron donor compounds optionally may be included in the multiphoton photoinitiator system. Multiphoton photoinitiator systems comprising one-photon photoinitiators and/or electron donor compounds are described in Assignee's co-pending application Ser. No. 10/964,510 titled MULTIPHOTON PHOTOSENSITIZATION SYSTEM, filed concurrently herewith on Jun. 14, 2001, in the name of Robert J. DeVoe, the entirety of which is incorporated herein by reference.

One-photon photoinitiators useful in the present invention include onium salts, such as sulfonium, diazonium, azinium, and iodonium salts such as a diaryliodonium salt, chloromethylated triazines, such as 2-methyl-4,6-bis(trichloromethyl)-s-triazine, and triphenylimidazolyl dimers. Useful iodonium salts are those that are capable of initiating polymerization following one-electron reduction or those that decompose to form a polymerization-initiating species. Suitable iodonium salts are described by Palazzotto et al., in U.S. Pat. No. 5,545,676, in column 2, lines 28 through 46. Useful chloromethylated triazines include those described in U.S. Pat. No. 3,779,778, column 8, lines 45-50. Useful triphenylimidazolyl dimers include those described in U.S. Pat. No. 4,963,471, column 8, lines 18-28, the teachings of which are incorporated herein by reference. These dimers include, for example, 2-(o-chlorophenyl)-4,5-bis(m-methoxyphenyl) imidazole dimer.

As described in Assignee's co-pending application Ser. No. 10/964,510 titled MULTIPHOTON PHOTOSENSITIZATION SYSTEM, filed concurrently herewith on Jun. 14, 2001, in the name of Robert J. DeVoe, such other components also may include both an electron donor compound and a photoinitiator. Advantageously, use of this combination enhances the speed and resolution of multiphoton curing. The photoinitiator serves double duty, as well, by also optionally facilitating blanket photodefining of the photodefinable composition with suitable curing energy. When such an electron donor and/or single photon initiator are used, the composition may include up to about 10, preferably 0.1 to 10, parts by weight of one or more electron donors and 0.1 to 10, preferably 0.1 to 5, parts by weight of one or more single photon initiators per 5 to 100 parts by weight of the multiphoton initiator.

A wide variety of optional adjuvants may also be included in the photopolymerizable compositions of the present invention, depending upon the desired end use. Suitable adjuvants include solvents, diluentsplasticizers, pigments, dyes, inorganic or organic reinforcing or extending fillers, thixotropic agents, indicators, inhibitors, stabilizers, ultraviolet absorbers, medicaments (for example, leachable fluorides), and the like, but should be chosen so as not to unduly adversely affect the optical properties of the resultant optical elements. The amounts and types of such adjuvants and their manner of addition to the compositions will be familiar to those skilled in the art.

The photopolymerizable compositions of the present invention can be prepared by any suitable method in accordance with conventional practices. In one approach, the components are combined under "safe light" conditions using any order and manner of combination (optionally, with stirring or agitation), although it is sometimes preferable (from a shelf life and thermal stability standpoint) to add the photoinitiator (s) last (and after any heating step that is optionally used to facilitate dissolution of other components). Solvent can be used, if desired, provided that the solvent is chosen so as to not react appreciably with the components of the composition. Suitable solvents include, for example, acetone, dichloromethane and other halogenated (preferably chlorinated) hydrocarbons, and acetonitrile. The monomeric constituents of the photopolymerizable precursor sometimes serve as a solvent for the other components.

Figure 5:
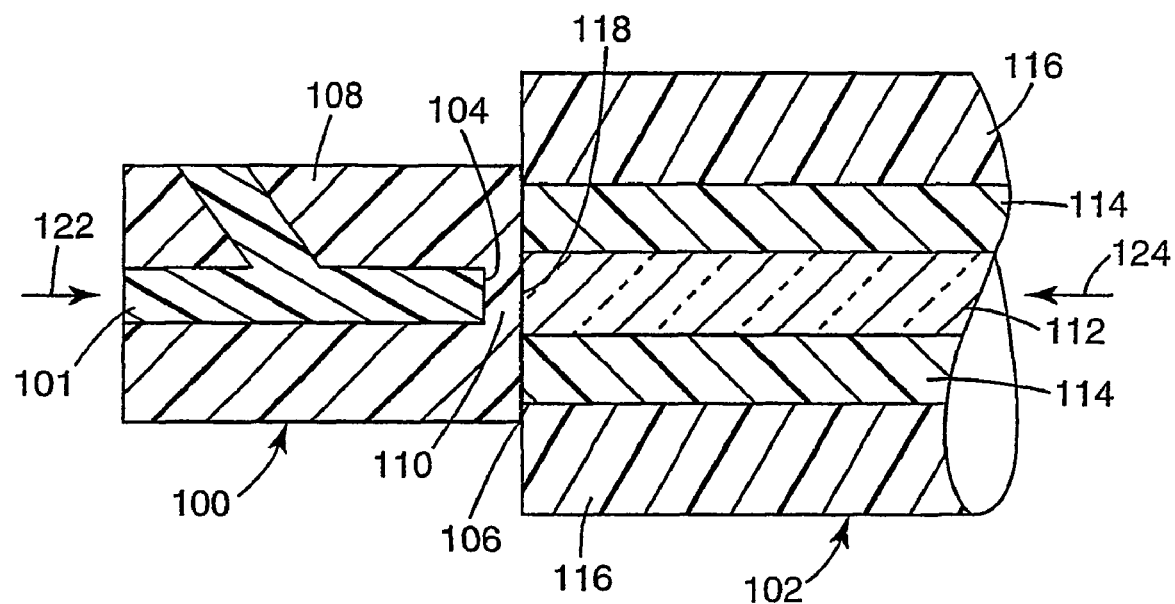
FIG. 5 schematically illustrate a preferred mode of implementing the present invention in which a partially completed encapsulated optical element is completed in situ to couple the element to another optical device.

FIG. 5 schematically illustrate a preferred mode of implementing the present invention in which a device 100 of the present invention incorporating a partially completed encapsulated optical element in the form of waveguide 101 is completed in situ to optically couple the element 101 to another optical device 102. The first device 100 is butted against the second optical device 102. Waveguide 101 is partially completed in the sense that end 104 of waveguide 101 does not fully extend to boundary 106. Waveguide 101 is surrounded by encapsulating material 108. Material 108 is photocurable, and preferably includes photocurable material and a multiphoton photoinitiator system as described herein, allowing material 108 to be imagewise photocured via multiphoton polymerization techniques and/or via blanket irradiation techniques. Thus, a region 110 of such photocurable material is positioned between end 104 and boundary 106.

Second optical device 102, for purposes of illustration includes glass fiber core 112 surrounded by cladding 114. A protective layer 116, in turn, surrounds cladding 114. An end 118 of glass fiber core 112 is at least in substantial alignment with end 104 of waveguide 101. In the practice of the invention, precise alignment between ends 104 and 118 is not required to achieve effective coupling between waveguide 101 and glass fiber core 112. For example, it is possible for the longitudinal axes of waveguide 101 and core 112 to be slightly out of alignment with respect to each other by up to a few degrees or less, preferably 1 degree or less, more preferably 0.1 degree or less. Additionally, ends 104 and 118 also may be offset from each other. The ability to couple elements together with relaxed tolerances is a tremendous advantage of the present invention. In contrast, conventional coupling processes require much greater precision when two optical elements are to be joined to each other.

In the practice of the invention, region 110 will be photocured in situ to finish waveguide 101 and thereby couple waveguide 101 and fiber core 112 together. The width of region 110 can vary within a wide range while still allowing such in situ curing to be carried out. As suggested guidelines, the width of region 110 between waveguide 101 and fiber core 112 may range from a few nanometer to a few millimeters, more preferably, 50 nm to 500 micrometers, most preferably about 50 nm to about 0.2 micrometers.

FIG. 5 shows one manner by which in situ curing of first element 100 can be carried out with relative ease. Light of suitable wavelength (e.g., matching the wavelength of light that may be guided by waveguide 101 and/or glass fiber core 112) and intensity to cause multiphoton polymerization is caused to enter waveguide 101, glass fiber core 112, or both. As shown in FIG. 5, laser light pulses 122 and 124 are introduced through both waveguide 101 and core 112 towards region 110. At least some of such light will be guided by waveguide 101 and fiber core 112, respectively, and be transmitted through region 110. As a consequence, portions of region 110 will absorb the light and be photocured as a consequence. Waveguide 101 is thus completed and becomes optically coupled to glass fiber core 112. After waveguide 101 has been completed and coupled to fiber core 112 in situ in this manner, first optical device 100 may be subjected to suitable blanket irradiation to photocure matrix material 108 and form a protective encapsulating matrix at least around waveguide 101.

The process depicted in FIG. 5 has many advantages. First, as noted above, the method provides an alignment advantage in that the two optical devices 100 and 102 need not be precisely aligned in order for effective coupling to be carried out. Second, because material 108 is not fully cured when the two devices are butted against each other, the present invention reduces the need to polish the butted faces of device 100 and/or 102 before the two devices are butted together. This eliminates the need for the polishing step in the manufacturing process, helping to make the process economical and reducing cycle time. Third, because alignment tolerances are more relaxed, insertion losses are reduced.

In FIG. 5, only device 100 incorporates the partially completed waveguide 101, while device 102 is completed. However, the methodology of FIG. 5 may also be used to couple two devices together in which each includes at least one light guiding portion (comparable to region 108 of FIG. 5) that will be completed in situ after the two devices are positioned together.

Objects and advantages of this invention are further illustrated by the following examples, but the particular materials and amounts thereof recited in these examples, as well as other conditions and details, should not be construed to unduly limit this invention.

EXAMPLE 1

A solution (40% solids in methylene chloride) containing 40% by weight polymethyl methacrylate (mw 120,000, n=1.490, Aldrich Chemical Co., Milwaukee, Wis.), 25% by weight phenoxyethyl acrylate, 34% by weight of bisphenol A glycerolate diacrylate (Ebecryl 3700™, UCB Chemicals, Symrna, Ga.), and 1% by weight 4,4'-bis(diphenylamino)-trans-stilbene is prepared. The solution is coated on a silicon wafer approximately 500 microns thick and dried in an oven at 60° C. Exposure is performed using a two-photon microscope with a Ti:Sapphire laser operating the two-photon absorption maximum of 4,4'-bis(diphenylamino)-trans-stilbene, 700 nm, and the light is focused through an oil-immersion objective with NA=1.4. X-Y-Z control of the sample is accomplished using a manipulator mounted on the microscope stage. A pattern of interconnected waveguides with primary axes parallel and perpendicular to the plane of the film is written into the medium, resulting in a three dimensional image of the pattern, wherein the refractive index modulation of the cured waveguides is at least 0.01 relative to the subsequently-cured matrix. The coating is then blanket-exposed in a non-imagewise manner using a bank of 6 Sylvania F 15T8/350BL bulbs with primary output at 350 nm (Osram Sylvania, Inc., Danvers, Mass.) for 10 minutes. The film maintains a refractive index modulation of at least 0.01 relative to the waveguides, with the waveguides capable of effectively carrying injected light.

EXAMPLE 2

A solution (40% solids in methylene chloride) containing 60% by weight cellulose acetate butyrate (MW 70,000, 13.5 wt % acetyl, 37 wt % butyryl, Aldrich Chemical Co., Milwaukee, Wis.), 25% by weight phenoxyethyl acrylate (Aldrich Chemical Co.), 34% by weight bisphenol A glycerolate diacrylate (Ebecryl 3700™, UCB Chemicals), and 1% by weight 4,4'-bis(diphenylamino)-trans-stilbene is prepared. The solution is coated on a silicon wafer approximately 500 microns thick and dried in an oven at 60° C. Exposure is performed using a two-photon microscope with a Ti:Sapphire laser operating at the two-photon absorption maximum of 4,4'-bis(diphenylamino)-trans-stilbene, 700 nm, and the light is focused through an oil-immersion objective with NA=1.4. X-Y-Z control of the sample is accomplished using a manipulator mounted on the microscope stage. A pattern of interconnected waveguides with primary axes parallel and perpendicular to the plane of the film is written into the medium, resulting in a three dimensional image of the pattern, wherein the refractive index modulation is at least 0.01. The coating is then blanket-exposed in a non-imagewise manner using a bank of 6 Sylvania F15T8/350BL bulbs having a primary output at 350 nm (Osram Sylvania, Inc.) for 10 minutes. The film maintains a refractive index modulation of at least 0.01 relative to the waveguides, with the waveguides capable of effectively carrying injected light.

MATERIALS USED IN EXAMPLES 3-5

Unless otherwise noted, chemicals used in the examples 3-5 were commercially available from Aldrich Chemical Co., Milwaukee, Wis. CGI 7460 was a borate salt that was commercially available from Ciba Specialty Chemicals, Tarrytown, N.Y., and CD1012 is a diaryliodonium hexafluoroantimonate salt that was commercially available from Sartomer Company, West Chester, Pa. The material 2-(1-Naphthoxy) ethyl acrylate was made in accordance with the procedure described prior to Example 1 at page 13 of assignee's co-ending application Ser. No. 09/746,613, filed Dec. 21, 2000.

The two-photon sensitizing dye, Bis-[4-(diphenylamino) stryl]-1,4-(dimethoxy)benzene was prepared as follows:

(1) Reaction of 1,4-bis-bromomethyl-2,5-dimethoxybenzene with triethyl phosphite: 1,4-bis-bromomethyl-2,5-dimethoxybenzene was prepared according to the literature procedure (Syper et. al., Tetrahedron, 1983, 39, 781-792). 1,4-bis-bromomethyl-2,5-dimethoxybenzene (253 g, 0.78 mol) was placed into a 1000 mL round bottom flask. Triethyl phosphite, P(OEt)$_3$, (300 g, 2.10 mol) was added. The reaction was heated to vigorous reflux with stirring for 48 hours under nitrogen atmosphere. The reaction mixture was cooled and the excess P(OEt)$_3$ was removed under vacuum using a Kugelrohr apparatus. The desired product was not actually distilled, but a Kugelrohr apparatus was used to remove the excess P(OEt)$_3$ by distilling it away from the product. Upon heating to 100° C. at 0.1 mmHg, a clear oil resulted. Upon cooling, the desired product solidified. The product was suitable for use directly in the next step, and $^1$H NMR was consistent with the proposed structure:

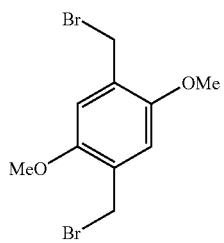

Re-crystallization from toluene yielded colorless needles and resulted in a purer product, but this was not necessary for subsequent steps in most cases.

(2) Synthesis of Bis-[4-(diphenylamino)stryl]-1,4-(dimethoxy)benzene: A 1000 mL round bottom flask was fitted with a calibrated dropping funnel and a magnetic stirrer. The flask was charged with the Homer Eamons reagent as prepared above (19.8 g, 45.2 mal), and it was also charged with N,N-diphenylamino-p-benzaldehyde (Fluka, 25 g, 91.5 mmol). The flask was flushed with nitrogen and sealed with septa. Anhydrous tetrahydrofuran (750 mL) was cannulated into the flask and all solids dissolved. The dropping funnel was charged with KOtBu (Potassium tert-butoxide) (125 mL, 1.0 M in THF). The solution in the flask was stirred and the KOtBu solution was added to the contents of the flask over the course of 30 minutes. The solution was then left to stir at ambient temperature overnight. The reaction was then quenched by the addition of H$_2$O (500 mL). The reaction continued to stir and after about 30 minutes a highly fluorescent yellow solid had formed in the flask. The solid was isolated by filtration and air-dried. It was then re-crystallized from toluene (450 mL). The desired product was obtained as fluorescent needles (24.7 g, 81% yield). $^1$H NMR was consistent with the proposed structure:

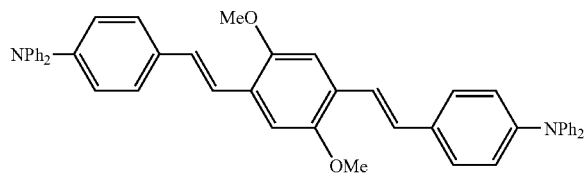

EXAMPLE 3

A low refractive index buffer layer between glass and active layers was prepared by spin coating a solution of the composition given in Table 1 (16% solids in 1,2-dichloroethane) onto microscope slides, evaporating the solvent in an 80° C. oven for 10 minutes, and then curing for 10 minutes under Sylvania 350BLB UV lights. The cured buffer layer thickness was approximately 10 microns thick.

TABLE 1

Composition of the buffer layer

| Ingredient | Weight % |
| --- | --- |
| Cellulose acetate butyrate (Eastman Chemicals, Kingsport, TN) | 89.37 |
| Trimethylpropane triacrylate, SR-351 (Sartomer Co. West Chester, PA) | 8.94 |
| Benzil dimethyl ketal, Esacure KB1 (Sartomer Co. West Chester, PA) | 1.70 |

The active layer, the composition of which is given in Table 2, was then spun coat from 25% solids solution in 1,2-dichloroethane on top of the prepared buffer layer and dried in an 80° C. oven for 10 minutes. To further increase the thickness, a second active layer was spun on top and the samples dried again. The final thickness of the curable coating, including buffer layer was approximately 65 microns. All sample preparation was done under safe lights. The dried samples were stored in a light-tight box prior to exposure.

TABLE 2

Composition of the active layer

| Ingredient | Weight % |
| --- | --- |
| Cellulose acetate butyrate (Eastman Chemicals, Kingsport, TN) | 50.71 |
| 2-phenoxyethyl acrylate, SR339 (Sartomer Co. West Chester, PA) | 37.48 |
| 2-(1-Naphthoxy)ethyl acrylate | 6.25 |
| Trimethylpropane triacrylate, SR-351 (Sartomer Co. West Chester, PA) | 0.89 |
| Bis-[4-(diphenylamino)stryl]-1,4-(dimethoxy)benzene | 0.93 |
| CGI 7460 (Ciba Specialty Chemicals, Tarrytown, NY) | 1.87 |
| CD1012 (Sartomer Co. West Chester, PA) | 1.87 |

Exposure of the curable composition covered substrate occurred by continuously moving the sample beneath a highly focused light from a microscope objective. The focal position of the beam was positioned below the surface of the curable composition. The light source was a diode pumped Ti:sapphire laser (Spectra-Physics) operating at a wavelength of 800 nm, pulse width 100 fs, pulse repetition rate of 80 MHz, beam diameter of approximately 2 mm. The optical train included low dispersion turning mirrors, an optical attenuator to vary the optical power, and a 40× microscope objective to focus the light into the sample. In all cases the average power delivered to the sample (98 mW) was measured where the beam exited the microscope objective using a Coherent Power Meter. The substrate was moved underneath the focussed beam using a computer controlled, 3-axis stage. A pattern of waveguides and splitters was written into the medium. The coating was then blanket-exposed in a non-image wise manner using a bank of 3 Phillips TLD 15W-03 bulbs for 45 minutes.

For waveguide optical mode and loss measurements, a glass microscope slide was bonded on top of the device using OG125 low refractive index epoxy (EPO-TEK, Billerica, Mass.). The sample was then diced using a die saw to expose the ends of the waveguides. A 9 micrometer core diameter telecommunications optical fiber was aligned with one of the waveguides and positioned to provide a maximum light intensity at the output end using a 3-axis micropositioner. 1550 nm wavelength light was introduced into the polished input ends of the waveguide using a ILX Lightwave 7000 system, precision fiber optic source. The near field light distribution was imaged using 5× microscope objective and an infrared camera. The images showed that the waveguide supported 2 TE modes at 1550 nm. When 657 nm light was input into the waveguide, the waveguide showed multimode behavior.

For loss measurements, the transmitted light was directed onto a Hewlett Packard GMGH germanium photodetector and the transmitted power measured. The input power was determined immediately after the measurement by removing the sample and positioning the input fiber where the output end of the waveguide had been, thereby capturing the input reference power with the same optical path and equipment by which the transmitted light power had been determined. Input power levels were about 30 to 100 microwatts, depending on the source. The loss at 1550 nm was measured as approximately 5.4 dB/cm. The losses increased with decreasing wavelength.

EXAMPLE 4

In this example, the dose of curing energy received by the samples was varied in order to control the refractive index contrast. A sample of the same composition as described in Tables 1 and 2 was prepared and exposed using a 60× microscope objective (N.A. in air is 0.85) and an average power of 106 mW. The sample was positioned so that the focal point of the beam was approximately in the middle of the curable layer. Waveguides were created by scanning the sample under the focussed beam at speeds from ranging from 50 micrometers/s to 51.2 mm/s. The coating was then blanket-exposed in a non-image wise manner using a bank of 3 Phillips TLD 15W-03 bulbs for 45 minutes. The refractive index of each waveguide was determined using Mach Zehnder interferometry on a Jena Interference microscope with white light. The refractive index of the bulk film was determined to be 1.49 using the Jena Interferometer. The data showed that the refractive index contrast in the waveguide increased with the log of increasing dose substantially linearly from a contrast of about 0.002 at −4.5 (log dose, J/micrometer) to about 0.063 at −2.8 (log dose, J/micrometer). The dose was determined by the average power divided by the linear scan speed and has units of Joules per micron. Over this energy range there was no evidence of sample damage.

EXAMPLE 5

In this example, waveguides and Y-splitters are demonstrated. A sample of the same composition as described in Tables 1 and 2 was prepared and exposed using a 40× microscope objective (N.A. in air is 0.65) and an average power of 60 mW. A 10 cm focal length field lens was placed in the optical train in order to expand the beam to fill the full aperture of the microscope objective. The Y-splitter was written by making 5 passes at 20 mm/s over the same pattern. Optical micrographs were used to observe the splitter viewed from the top and in cross-section. The splitter was clearly encapsulated within the bulk of the material, and the lateral width of each arm was about 2 micrometers. In cross-section, the structure included, in order from the top, a glass layer, a layer of the treated composition, an epoxy layer, and another glass layer. For the cross-section image, a glass slide was bonded to the top surface as described in example 3 and the sample diced to expose the ends of the waveguide.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of coupling a first optical device to a second optical device, comprising the steps of:
   (a) providing the first optical element device, said first device including a partially formed, first optical element at least partially encapsulated in ingredients comprising (1) a photocurable matrix precursor comprising a diffusing species, said precursor forming a polymer matrix upon photocuring, and said polymer matrix having an index of refraction, (2) a substantially non-diffusing binder having an index of refraction that is lower than the index of refraction of the polymer matrix and that is miscible with the photocurable matrix precursor, and (3) a multiphoton photoinitiator system; and said partially formed optical element having an end that is spaced apart from a boundary of the device such that a multiphoton photocurable region is juxtaposed between the end and the boundary;
   (b) providing the second optical element device, said second device including a second optical element having an end to be coupled to the first optical element;
   (c) positioning the first optical element device adjacent the second optical element device to at least approximately juxtapose the ends of the first and second optical elements in alignment with each other, wherein the multiphoton photocurable region is positioned between said ends;
   (d) imagewise exposing at least a portion of said region under conditions such that the ends of the first and second optical elements are optically coupled together; and
   (e) after said imagewise exposing, nonimagewise exposing at least a portion of said region to a photopolymerizing fluence of energy.

2. The method of claim 1, wherein the binder is derived from ingredients comprising a thermoplastic polymer.

3. The method of claim 1, wherein the binder is derived from ingredients comprising a thermosetting polymer having substantially no photocurable functionality.

4. The method of claim 1, wherein the multiphoton photoinitiator system comprises a multiphoton photosensitizer.

5. The method of claim 4, wherein the multiphoton photoinitiator system further comprises a single photon photoinitiator.

6. The method of claim 5, wherein the multiphoton photoinitiator system further comprises a an electron donor.

7. The method of claim 1, wherein the nonimagewise exposing step comprises causing single photon polymerization.

8. The method of claim 1, wherein the nonimagewise exposing step comprises causing multiphoton polymerization.

9. The method of claim 1, wherein the imagewise exposing step comprises causing a depletion zone to be formed at a boundary of the exposed portion of said region, said depletion zone comprising a reduced amount of the diffusing species.

10. The method of claim 1, wherein the imagewise exposing step comprises causing a plurality of femtosecond laser pulses to be directed into at least a portion of said region.

11. The method of claim 1, wherein said region comprises a homogeneous admixture of ingredients comprising said precursor and said binder.

12. The method of claim 1, wherein the exposed portion of said region is a waveguide.

13. The method of claim 1, wherein said imagewise exposure step occurs non-holographically.

14. The method of claim 1, wherein the precursor comprises at least one aromatic (meth)acrylate monomer.

15. The method of claim 1, wherein the precursor comprises at least one aromatic (meth)acrylate comprising a fluorinated moiety.

16. The method of claim 1, wherein the precursor comprises (a) 10 to 100 parts by weight of at least one of 2-(1-napthoxy)ethyl (meth)acrylate, 2-(2-napthoxy)ethyl (meth)acrylate, phenoxy(meth)acrylate, and mixtures thereof per (b) 0.5 to 50 parts by weight of at least one multifunctional (meth)acrylate monomer.

17. The method of claim 16, wherein the multifunctional (meth)aciylate monomer comprises at least one of trimethyloipropane tri(meth)acrylate (TMPTA), hexanediol di(meth)acrylate, tetraethyleneglycol di(meth)acrylate, and mixtures thereof.

* * * * *

UNITED STATES PATENT AND TRADEMARK OFFICE
CERTIFICATE OF CORRECTION

PATENT NO. : 7,601,484 B2
APPLICATION NO. : 11/282927
DATED : October 13, 2009
INVENTOR(S) : Robert J DeVoe It is certified that error appears in the above-identified patent and that said Letters Patent is hereby corrected as shown below:

Title page, Page 3 - Column 1 Item [56] (Other Publications)
Line 2;   Delete "confacl" and insert -- confocal --, therefor.
Line 7;   Delete "Femosecond" and insert -- Femtosecond --, therefor.
Line 20;  Delete "copnfocal" and insert -- confocal --, therefor.
Line 22;  Delete "discusssed" and insert -- discussed --, therefor.
Line 59;  Delete "Polymcrization" and insert -- Polymerization --, therefor.

Title page, Page 3 - Column 2 Item [56] (Other Publications)
Line 14;  Delete "Photopolmers" and insert -- Photopolymers --, therefor.
Line 18;  Delete "Photon-Iduces" and insert -- Photon-Induces --, therefor.
Line 28;  Delete "Photacids" and insert -- Photoacids --, therefor.
Line 37;  Delete "Photoreponsive" and insert -- Photoresponsive --, therefor.
Line 41;  Delete "Photpolymerization" and insert -- Photopolymerization --, therefor.
Line 50;  Delete "Thresold" and insert -- Threshold --, therefor.

Column 6
Line 31 (Approx.);   Delete "galvonometer" and insert -- galvanometer --, therefor.

Column 11
Line 20;  Delete "etrahydrofurfuryl" and insert -- tetrahydrofurfuryl --, therefor.

Column 13
Line 62;  Delete "HeloXy™" and insert -- Heloxy™ --, therefor.

Column 15
Line 15;  Delete "2-(1-napthoxy)ethyl" and insert -- 2-(1-naphthoxy)ethyl --, therefor.
Line 16;  Delete "2-(2-napthoxy)ethyl" and insert -- 2-(2-naphthoxy)ethyl --, therefor.

Signed and Sealed this
Twenty-ninth Day of March, 2011

David J. Kappos
*Director of the United States Patent and Trademark Office*

CERTIFICATE OF CORRECTION (continued)
U.S. Pat. No. 7,601,484 B2

Column 23
Line 33 (Approx.);    Delete "Homer" and insert -- Horner --, therefor.

Column 26
Line 54;    In Claim 6, after "comprises" delete "a".

Column 28
Line 2-3; therefor.    In Claim 16, delete "2-(1-napthoxy)ethyl" and insert -- 2-(1-naphthoxy)ethyl --,
Line 3; therefor.    In Claim 16, delete "2-(2-napthoxy)ethyl" and insert -- 2-(2-naphthoxy)ethyl --,
Line 8;    In Claim 19, delete "(meth)aciylate" and insert -- (meth)acrylate --, therefor.
Line 9;    In Claim 19, delete "loipropane" and insert -- lolpropane --, therefor.

UNITED STATES PATENT AND TRADEMARK OFFICE
CERTIFICATE OF CORRECTION

PATENT NO. : 7,601,484 B2  
APPLICATION NO. : 11/282927  
DATED : October 13, 2009  
INVENTOR(S) : Robert J DeVoe Page 1 of 2

It is certified that error appears in the above-identified patent and that said Letters Patent is hereby corrected as shown below:

Title page, Page 3 - Column 1 Item [56] (Other Publications)
Line 2;   Delete "confacl" and insert -- confocal --, therefor.
Line 7;   Delete "Femosecond" and insert -- Femtosecond --, therefor.
Line 20;  Delete "copnfocal" and insert -- confocal --, therefor.
Line 22;  Delete "discusssed" and insert -- discussed --, therefor.
Line 59;  Delete "Polymcrization" and insert -- Polymerization --, therefor.

Title page, Page 3 - Column 2 Item [56] (Other Publications)
Line 14;  Delete "Photopolmers" and insert -- Photopolymers --, therefor.
Line 18;  Delete "Photon-Iduces" and insert -- Photon-Induces --, therefor.
Line 28;  Delete "Photacids" and insert -- Photoacids --, therefor.
Line 37;  Delete "Photoreponsive" and insert -- Photoresponsive --, therefor.
Line 41;  Delete "Photpolymerization" and insert -- Photopolymerization --, therefor.
Line 50;  Delete "Thresold" and insert -- Threshold --, therefor.

Column 6
Line 31 (Approx.);   Delete "galvonometer" and insert -- galvanometer --, therefor.

Column 11
Line 20;   Delete "etrahydrofurfuryl" and insert -- tetrahydrofurfuryl --, therefor.

Column 13
Line 62;   Delete "HeloXy™" and insert -- Heloxy™ --, therefor.

Column 15
Line 15;   Delete "2-(1-napthoxy)ethyl" and insert -- 2-(1-naphthoxy)ethyl --, therefor.
Line 16;   Delete "2-(2-napthoxy)ethyl" and insert -- 2-(2-naphthoxy)ethyl --, therefor.

This certificate supersedes the Certificate of Correction issued March 29, 2011.

Signed and Sealed this
Third Day of May, 2011

David J. Kappos
*Director of the United States Patent and Trademark Office*

CERTIFICATE OF CORRECTION (continued)
U.S. Pat. No. 7,601,484 B2

Column 23
Line 33 (Approx.);    Delete "Homer" and insert -- Horner --, therefor.

Column 26
Line 54;    In Claim 6, after "comprises" delete "a".

Column 28
Line 2-3;    In Claim 16, delete "2-(1-napthoxy)ethyl" and insert -- 2-(1-naphthoxy)ethyl --, therefor.
Line 3;    In Claim 16, delete "2-(2-napthoxy)ethyl" and insert -- 2-(2-naphthoxy)ethyl --, therefor.
Line 8;    In Claim 17, delete "(meth)aciylate" and insert -- (meth)acrylate --, therefor.
Line 9;    In Claim 17, delete "loipropane" and insert -- lolpropane --, therefor.